(12) United States Patent
Arita et al.

(10) Patent No.: US 6,205,367 B1
(45) Date of Patent: Mar. 20, 2001

(54) APPARATUS FOR SUPPORTING EQUIPMENT OPERABILITY EVALUATION

(75) Inventors: Yuichi Arita; Naoyuki Nozaki; Koji Demizu, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/929,669

(22) Filed: Sep. 15, 1997

(30) Foreign Application Priority Data

Feb. 27, 1997 (JP) .................................................... 9-044455

(51) Int. Cl.⁷ .................................................... G06F 19/00
(52) U.S. Cl. ................................ 700/98; 700/108; 345/31
(58) Field of Search ............................ 700/98, 108, 111; 345/31, 121; 395/119

(56) References Cited

U.S. PATENT DOCUMENTS

| | | | |
|---|---|---|---|
| 5,305,429 | * 4/1994 | Sato et al. | 395/119 |
| 5,495,568 | * 2/1996 | Beavin | 700/83 |
| 5,850,222 | * 12/1998 | Cone | 345/418 |

* cited by examiner

Primary Examiner—William Grant
Assistant Examiner—Kidest Bahta
(74) Attorney, Agent, or Firm—Staas & Halsey LLP

(57) ABSTRACT

There is disclosed an apparatus for supporting an evaluation of equipment operability in which simulation equipment models of design object equipment or layout object equipment are arranged in a simulation space together with simulation body-shaped models patterned after humans who may operate the equipment, and the body-shaped models are moved within the simulation space so that an evaluation of operability of the layout object equipment is supported. A reference position of a body-shaped model to be arranged in the simulation space is defined in accordance with a basic posture of the body-shaped model. When the present model is changed to a body-shaped model which is different in the body form, the body-shaped model after an alteration is arranged in the simulation space so that the reference position coincides with the reference position before the alteration.

14 Claims, 26 Drawing Sheets

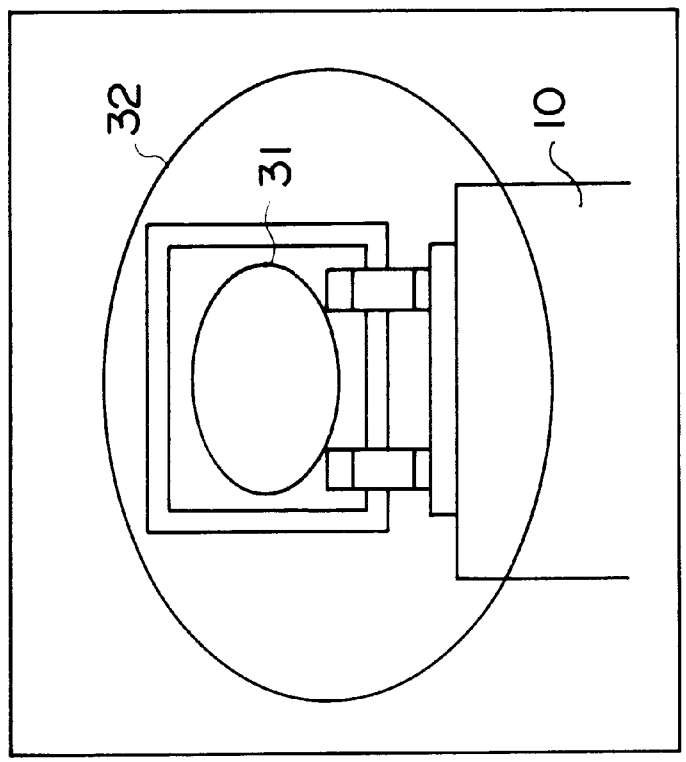
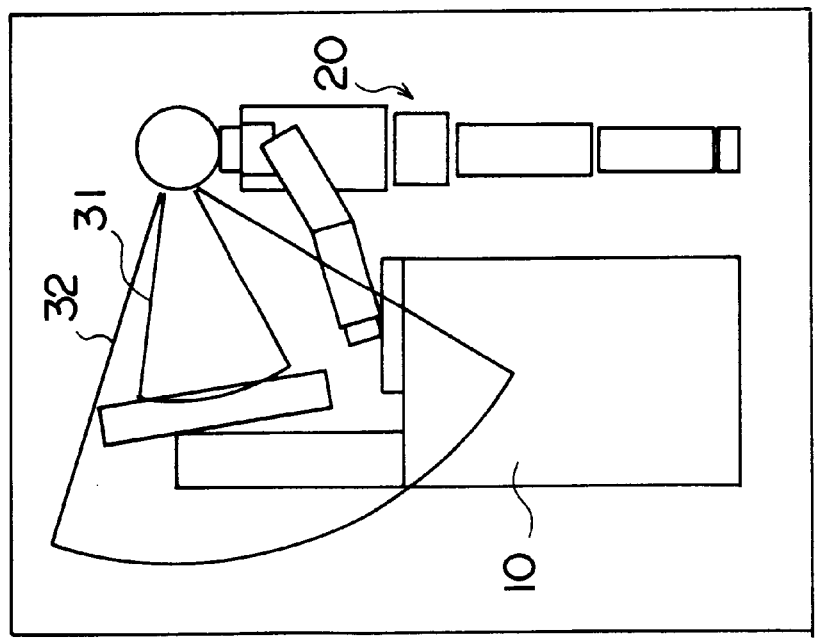
Fig. 10 (A)
Fig. 10 (B)

APPARATUS FOR SUPPORTING EQUIPMENT OPERABILITY EVALUATION

BACKGROUND OF THE INVENTION

1. Field of the Invention

The present invention relates to an apparatus for supporting an evaluation of equipment operability in which simulation equipment models of design object equipment or layout object equipment are arranged in a three-dimensional virtual space together with simulation body-shaped models patterned after humans who may operate the equipment, and the body-shaped models are moved within the three-dimensional virtual space so that an evaluation of operability of the layout object equipment is supported.

2. Description of the Related Art

Hitherto, in order to evaluate operability of each individual equipment or operability of equipment subjected to a layout process when the equipment items are viewed as a whole, a so-called mockup is built, and when operability of the equipment subjected to a layout process is evaluated, the mockup is actually subjected to a layout process. In this manner, the operability of equipment subjected to the layout is evaluated through performing an actual operation of the layout process. Thus, there may be a need to repeatedly build the mockup. This takes a lot of time for an evaluation of operability of equipment, and in addition, can be expensive.

For the reasons described above, it is expected that tools would appear that are capable of evaluating operability of equipment through a computer simulation without building a mockup.

On the other hand, there exists CAD systems and design tools having means in which design object equipment models or layout object equipment models are arranged in a three-dimensional virtual space together with body-shaped models. For example, according to a software simulation tool referred to as "ROBCAD/MAN" (a trademark of NIHON TECHOMATIX Co., Ltd.), the simulation is performed in such a manner that the equipment models and the body-shaped models are arranged in a three-dimensional virtual space, images involved in viewpoints of the body-shaped models and images involved in viewpoints different from the viewpoints of the body-shaped models are displayed, and the body-shaped models are operated to walk and/or change in their posture.

However, since simulation tools according to the earlier technology are built for the purpose of producing an animation, producing a product image plan, a study of assembly of a manual working apparatus, a comparison of machines with human in size, and the like, those simulation tools are not suitable for an equipment design taking into consideration operability on condition that a human operates the equipment, and a layout design of a system constituted of a plurality of equipment.

Specifically, in the event that the simulation tools according to the earlier technology are used for an evaluation of operability for the equipment subjected to a layout process or individual equipment, the simulation tools according to the earlier technology are associated with the following problems.

Equipment operated by humans need to be adapted to various human bodies and postures. Consequently, it is required that an inspection can easily be carried out using various body-shaped models and also an inspection can easily be carried out using a plurality of postures. However, the simulation tools according to the earlier technology need a lot of processes for those inspections, and thus it is not realistic.

Further, of equipment which humans operate, there exists ones which are available for users who need auxiliary instruments such as a wheelchair. The simulation tools according to the earlier technology permit, for example, a wheelchair-shaped model to be arranged, but have no means for readily inspecting an alteration of a wheelchair configuration and differences of man's figure and posture. Thus, there is a need to depend on a mockup scheme.

In the event that a simulation is carried out on a computer, images involved in viewpoints of the body-shaped models and images involved in viewpoints different from the viewpoints of the body-shaped models are displayed, and evaluation is performed through the displayed images. In this case, generally, it is not easy to grasp a position relation between man's viewpoint and another object and thus it is difficult to evaluate a simulation result.

Further, while the simulation tools according to the earlier technology are also provided with a function of displaying images involved in viewpoints of the body-shaped models, it is unclear as to what portions apparently appear or come in sight. Thus, it is a problem in evaluation of operability and visibility. Furthermore, in the event that the human observes a specified object closely, movements of his head portion and his eyeballs as well are important elements for an evaluation of the operability and the visibility. However, the simulation tools according to the earlier technology have no means for simulating those movements, and thus there is a limit in the inspection by the simulation.

Still furthermore, with respect to an equipment layout, a layout of displays, lamps and switches, and the like, a distance (a visual range) between those objects and a man's viewpoint becomes an important factor. However, the simulation tools according to the earlier technology have no means for readily obtaining the visual range.

Still further, in the simulation tools according to the earlier development, in the event that there exists a lot of equipment and switches as objects in operation, which will be difficult in a determination as to whether some operation is feasible or difficult, unless a body-shaped model is actually operated, there is a large number of combinations of operation, and thus a lot of time is required for an inspection of the body-shaped model.

SUMMARY OF THE INVENTION

In view of the foregoing, it is therefore an object of the present invention to provide an apparatus for supporting an evaluation of equipment operability capable of readily inspecting operability of equipment subjected to a layout process and operability of each individual equipment.

To attain the above mentioned object of the present invention, there is provided a first apparatus for supporting an evaluation of equipment operability in which an equipment model simulating a shape of an evaluation object equipment is arranged together with a body-shaped model simulating a shape of a human body in a three-dimensional virtual space, and an evaluation of operability of the evaluation object equipment is supported by means of moving the body-shaped model in the three-dimensional virtual space, said apparatus comprising:

a body-shaped model storage unit for storing a plurality of body-shaped models each simulating a shape of a human body and given a definition of a reference position, the reference position being set up in such a manner that when the plurality of body-shaped models are classified into one or more groups, the reference positions are located at mutually different positions on a body in associated groups, respectively, and the reference positions are located at a common position on a body in each group;

a body-shaped model selecting means for optionally selecting a body-shaped model arranged in the three-dimensional virtual space from among the body-shaped models stored in said body-shaped model storage unit;

model arrangement means for arranging the equipment model together with the body-shaped model selected by said body-shaped model selecting means in the three-dimensional virtual space, and when said body-shaped model selecting means selects, as a body-shaped model to be arranged in the three-dimensional virtual space, a body-shaped model which belongs to the same group as the body-shaped model now arranged in the three-dimensional virtual space, the body-shaped model before an alteration is replaced by the body-shaped model after an alteration in the three-dimensional virtual space in such a manner that the reference position of the body-shaped model before an alteration coincides with the reference position of the body-shaped model after an alteration in the three-dimensional virtual space; and an image display unit for displaying the three-dimensional virtual space, in which the equipment model and the body-shaped model are arranged by said model arrangement means, with an image looking from a viewpoint different from a viewpoint of the body-shaped model.

In the first apparatus for supporting an evaluation of equipment operability as mentioned above, it is preferable that said body-shaped model storage unit comprises:

a body-shaped model segments storage unit for storing body-shaped model segments simulating shapes of respective parts of a body for constituting a plurality of body-shaped models simulating respective shapes of a plurality of human bodies mutually different in a body form;

a segment arrangement data storage unit for storing segment arrangement data to constitute a body-shaped model by arranging the body-shaped model segments stored in said body-shaped model segments storage unit, the segment arrangement data being stored in said segment arrangement data storage unit in association with each of a plurality of postures of the body-shaped model; and a reference position data storage unit for storing reference position data representative of a reference position on a body-shaped model of which a position in the three-dimensional virtual space is defined regardless of a body form of the body-shaped model when the body-shaped model is arranged in the three-dimensional virtual space, wherein said body-shaped model selecting means comprises:

figure selecting means for optionally selecting a figure of a body-shaped model to be arranged in the three-dimensional virtual space; and posture designating means for optionally designating a posture of a body-shaped model to be arranged in the three-dimensional virtual space, and wherein said model arrangement means provides such a model arrangement that the equipment model is arranged in the three-dimensional virtual space, and in addition a body-shaped model having the figure selected by said figure selecting means is arranged in the posture designated by said posture designating means in the three-dimensional virtual space, and when the figure of the body-shaped model arranged in the three-dimensional virtual space is altered by said figure selecting means, the body-shaped model before an alteration is replaced by the body-shaped model after an alteration in the three-dimensional virtual space in such a manner that the posture of the body-shaped model after an alteration is identical to the posture of the body-shaped model before an alteration, and the reference position of the body-shaped model before an alteration coincides with the reference position of the body-shaped model after an alteration in the three-dimensional virtual space.

Here, the reference position of a body-shaped model refers to a position for ensuring the "same position" of the body-shaped model in the three-dimensional virtual space, for example, the bottom of foot in the standing posture, the hip below in the posture sitting on a chair, or the like, which is determined on each group of body-shaped models (typically each set of body-shaped models concerned with the same figure).

In the first apparatus for supporting an evaluation of equipment operability as mentioned above, it is preferable that said segment arrangement data storage unit stores movable limit data representative of a movable limit of segments of a body-shaped model in association with each of a plurality of postures of the body-shaped model.

The first apparatus further comprises movement instruction means for instructing a movement of the body-shaped model arranged in the three-dimensional virtual space.

In the first apparatus, the model arrangement means moves the body-shaped model arranged in the three-dimensional virtual space within a movable limit according to the posture of the body-shaped model in response to a movement instruction for the body-shaped model by said movement instruction means.

While operability of the equipment is evaluated by moving a body-shaped model in the three-dimensional virtual space, for example, in the event that the arm is moved for a working, a movement limit of the arm capable of effectively performing a work is varied in accordance with the posture. In view of the foregoing, the movable limit data representative of a movable limit of the body-shaped model segment is stored in association with the posture, and the body-shaped model arranged in the three-dimensional virtual space is moved within a movable limit according to the posture of the body-shaped model in response to a movement instruction for the body-shaped model. This feature makes it possible to perform a movement simulation suitable for the posture, whereby operability of the equipment is evaluated with greater accuracy.

In this case, it is preferable that the first apparatus for supporting an evaluation of equipment operability further comprises movement evaluation means for evaluating movement of the body-shaped model arranged in the three-dimensional virtual space.

While an evaluation of the operability of the equipment is finally made by a user (an operator) of the apparatus for supporting an evaluation of equipment operability, in the event that the body-shaped model is moved, an evaluation reference is established taking into account movement of the body-shaped model, for example, a movement, a rate of travel, an acceleration of travel and the like, and when a movement for the body-shaped model is designated, an evaluation on the movement is automatically made on the basis of the evaluation reference. This feature may prevent operator errors as to the final operability evaluation, and thus makes it possible to perform a more suitable final evaluation.

To attain the above mentioned object of the present invention, there is provided a second apparatus for supporting an evaluation of equipment operability in which an equipment model simulating a shape of an evaluation object equipment is arranged together with a body-shaped model simulating a shape of a human body in a three-dimensional virtual space, and an evaluation of operability of the evaluation object equipment is supported by means of moving the body-shaped model in the three-dimensional virtual space.

The second apparatus comprises a visual field pattern storage unit for storing a visual field pattern representative of a visual field of a body-shaped model.

The second apparatus also comprises an image display unit for displaying the three-dimensional virtual space, in which the equipment model and the body-shaped model are arranged, with an image looking from a viewpoint different from a viewpoint of the body-shaped model, and in addition displaying on the image of a display screen the visual field pattern representative of a visual field of a body-shaped model.

Displaying the visual field patterns on the image screen makes it possible to intuitively grasp a range concerned with the sight of a body-shaped model, and thus serves for an exact evaluation of the equipment operability.

In the second apparatus as mentioned above, it is preferable that the said visual field pattern storage unit stores a plurality of visual field patterns representative of a plurality of stages of visual fields mutually different in degree of visibility.

The second apparatus further comprises visual field selecting means for selecting visual fields for a display from among the plurality of stages of visual fields, permitting a simultaneous selection of the plurality of stages of visual fields.

In the second apparatus, the image display unit displays the visual field patterns, representative of one or more stages of visual fields selected by said visual field selecting means, of the body-shaped model appearing on the image of a display screen.

Displaying a plurality of visual field patterns representative of a plurality of stages of visual fields mutually different in degree of visibility, for example, a visual field pattern representative of a visual field ensuring a good visibility, and a visual field pattern representative of an indistinct visual field range, on a simultaneous display basis or on a switching basis, makes it possible to exactly grasp a visible range of the body-shaped model and also a degree of visibility, and thus serves for an exact evaluation of the equipment operability.

To attain the above mentioned object of the present invention, there is provided a third apparatus for supporting an evaluation of equipment operability in which an equipment model simulating a shape of an evaluation object equipment is arranged together with a body-shaped model simulating a shape of a human body in a three-dimensional virtual space, and an evaluation of operability of the evaluation object equipment is supported by means of moving the body-shaped model in the three-dimensional virtual space.

The third apparatus comprises a visual field pattern storage unit for storing a plurality of visual field patterns, indexing a plurality of stages of visual field limits mutually different in degree of visibility, on an image looking from a viewpoint of a body-shaped model arranged in the three-dimensional virtual space.

The third apparatus also comprises visual field selecting means for selecting visual field limits for a display from among the plurality of stages of visual field limits, permitting a simultaneous selection of the plurality of stages of visual field limits.

The third apparatus further comprises an image display unit for displaying the image looking from a viewpoint of the body-shaped model arranged in the three-dimensional virtual space, and also displaying on the image of a display screen the visual field patterns representative of one or more stages of visual field limits selected by said visual field selecting means.

Displaying the image looking from a viewpoint of the body-shaped model, and also displaying on the image of a display screen the visual field patterns representative of one or more stages of visual field limits, on a simultaneous display basis or on a selecting display basis, makes it possible to more readily grasp a visual field limit, having a certain visibility, of the body-shaped model.

In the third apparatus as mentioned above, it is preferable that said apparatus further comprises eyeball movement instruction means for instructing a movement of eyeballs of the body-shaped model arranged in the three-dimensional virtual space.

In the third apparatus, it is also preferable that said image display unit links in movement one of the visual field patterns displayed on the image of a screen looking from a viewpoint of the body-shaped model to the movement of eyeballs of the body-shaped model by said eyeball movement instruction means.

Moving one of the visual field patterns, for example, a visual field pattern representative of a visual field limit concerned with a close observation by the body-shaped model, in cooperation with the eyeball motion instruction, makes it possible to determine whether a desired point of the equipment can be closely observed by only the eye movement, or by a movement of the head for instance, thereby significantly contributing to a proper evaluation of operability.

Further, in the apparatus for supporting an evaluation of equipment operability according to the present invention, it is preferable that said apparatus further comprises:

object designating means for designating a desired object appearing on an image of a screen of said image display unit; and distance calculating means for calculating a distance between the object in the three-dimensional virtual space, designated by said object designating means, and a viewpoint of the body-shaped model arranged in the three-dimensional virtual space.

It is noted that a distance between the object in the three-dimensional virtual space and a viewpoint of the body-shaped model arranged in the three-dimensional virtual space is also one of the factors having a significant effect on operability.

Furthermore, in the apparatus for supporting an evaluation of equipment operability according to the present invention, it is preferable that said apparatus further comprises visual field in and out determination means for determining whether the equipment model arranged in the three-dimensional virtual space is in the visual field of the body-shaped model arranged in the three-dimensional virtual space.

It is also preferable that said image display unit displays on an image screen a determination result by said visual field in and out determination means.

While there has been described the embodiment of the present invention in which a visual field pattern is displayed on an image screen, it happens that it is hard with only the visual field pattern to determine whether the equipment model arranged in the three-dimensional dimensional virtual space is actually in the visual field of the body-shaped model arranged in the three-dimensional virtual space, or whether the equipment model is within a suitable distance limit. Thus, as described above, if it is determined as to whether the equipment model arranged in the three-dimensional virtual space is in the visual field of the body-shaped model, and a determination result is displayed, then it is possible to expect more exact determination.

Furthermore, in the apparatus for supporting an evaluation of equipment operability according to the present invention, it is preferable that said apparatus further comprises:

object designating means for designating a desired object appearing on an image of a screen of said image display unit; and visibility determination means for determining whether the object in the three-dimensional virtual space, designated by said object designating means, is visible for the body-shaped model arranged in the three-dimensional virtual space through a movement of the body-shaped model within a movable limit according to the posture thereof in the three-dimensional virtual space.

Providing a function of a determination as to whether the object is visible for the body-shaped model through a movement of the body-shaped model within a movable limit according to the posture thereof makes it possible to expect more exact evaluation on the operability in connection with the posture.

In this case, it is preferable that said apparatus further comprises distance calculating means for calculating a distance between the object and a viewpoint of the body-shaped model when determining by said visibility determination means that the object is visible.

This feature makes it possible to expect more exact evaluation on the operability in connection with the posture.

To attain the above mentioned object of the present invention, there is provided a fourth apparatus for supporting an evaluation of equipment operability in which an equipment model simulating a shape of an evaluation object equipment is arranged together with a body-shaped model simulating a shape of a human body in a three-dimensional virtual space, and an evaluation of operability of the evaluation object equipment is supported by means of moving the body-shaped model in the three-dimensional virtual space.

The fourth apparatus comprises an area index pattern storage unit for storing an area index pattern representative of possible work area of the body-shaped model in the three-dimensional virtual space, in association with a posture of the body-shaped model.

The fourth apparatus also comprises an image display unit for displaying the three-dimensional virtual space, in which the equipment model and the body-shaped model are arranged, with an image looking from a viewpoint different from a viewpoint of the body-shaped model, and in addition displaying on the image of a display screen the area index pattern representative of a possible work area of a body-shaped model.

While moving a body-shaped model makes it possible to know whether a certain work is possible, in some cases, it happens that it is troublesome to move a body-shaped model. Thus, as described above, if the work possible area according to the posture of the body-shaped model is displayed on the image screen, it is possible to apparently grasp a work possible area limit, thereby contributing to an improvement of efficiency of the operability evaluation.

In the fourth apparatus for supporting an evaluation of equipment operability as mentioned above, it is preferable that said area index pattern storage unit stores a plurality of work index patterns representative of a plurality of stages of work possible areas mutually different in degree of working property.

The fourth apparatus further comprises work possible area selecting means for selecting work possible areas for a display from among the plurality of stages of work possible areas, permitting a simultaneous selection of the plurality of stages of work possible areas.

In the fourth apparatus, the image display unit displays the area index patterns representative of one or more stages of work possible areas selected by said work possible area selecting means, of the body-shaped model appearing on the image of a display screen.

In a similar fashion to that of the visual field, also as to the work possible area, there exist an area on which a work can easily be performed, and an area on which a work can be performed, but not easily. In view of the foregoing, as mentioned above, there are prepared a plurality of work index patterns representative of a plurality of stages of work possible areas mutually different in degree of working property, and the area index patterns representative of one or more stages of work possible areas are displayed on a simultaneous display basis or on a selecting display basis. This feature makes it possible to readily grasp the work possible area and a degree of the working property as well, and thus serving for more exact evaluation of the equipment operability.

BRIEF DESCRIPTION OF THE DRAWINGS

FIGS. 10(A) and 10(B) are views showing an example of a display of a figure of a visual field;

DESCRIPTION OF THE PREFERRED EMBODIMENTS

Hereinafter, there will be described embodiments of the present invention.

Figure 1:
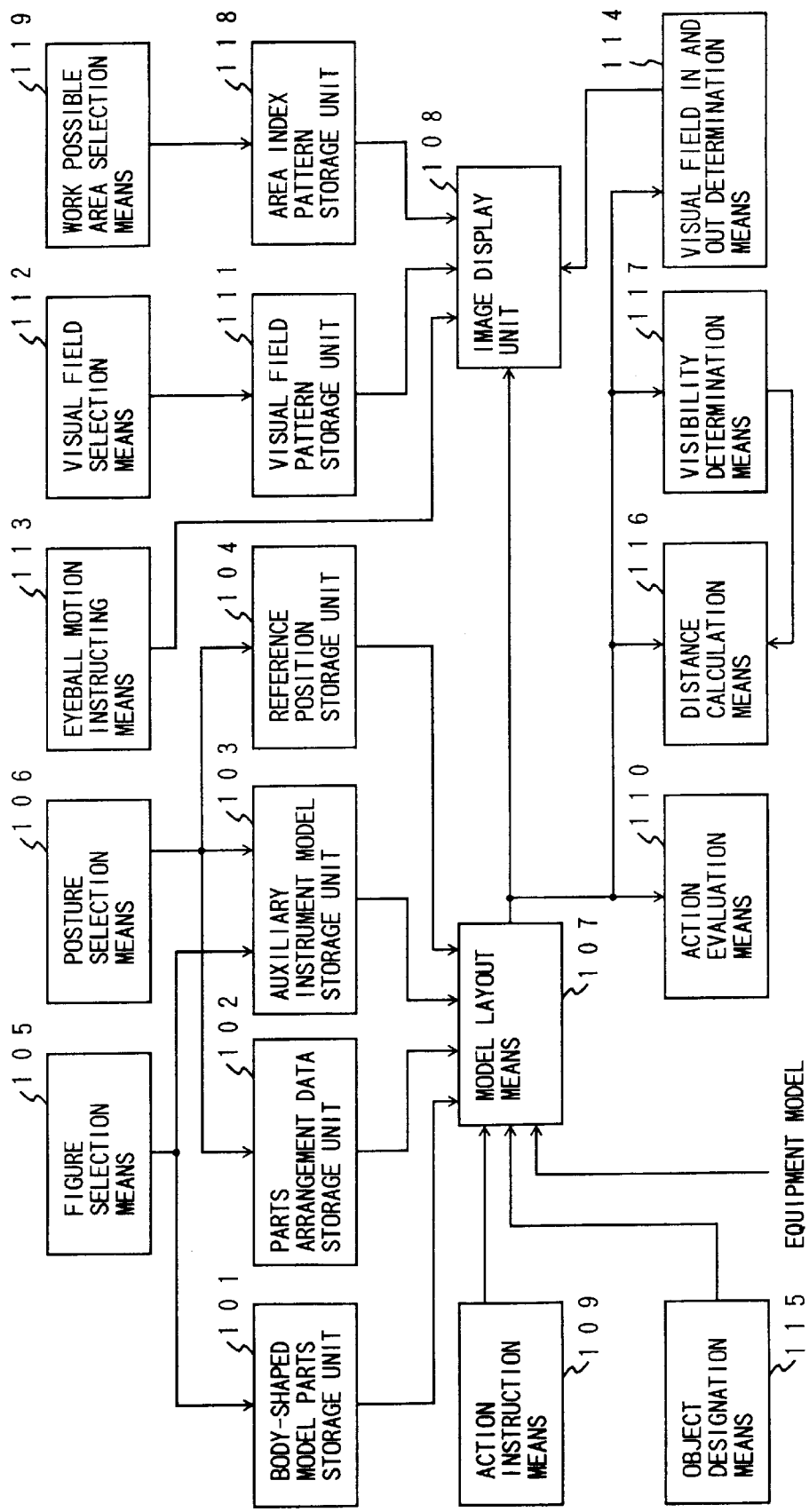
FIG. 1 is a block diagram of an apparatus for supporting an evaluation of equipment operability according to one embodiment of the present invention.

FIG. 1 is a block diagram of an apparatus for supporting an evaluation of equipment operability according to one embodiment of the present invention.

An apparatus 100 for supporting an evaluation of equipment operability supports an evaluation of operability of equipment as an object to be evaluated in such a manner that simulation equipment models, which are simulated as figures of equipment as objects to be evaluated, are arranged in a three-dimensional virtual space (simulation space) together with simulation body-shaped models, which are simulated in figures of human bodies, and the body-shaped models are operated within the three-dimensional virtual space or the simulation space so that an evaluation of operability of the equipment of interest is supported. Hereinafter, each individual block will be described.

A body-shaped model parts storage unit 101 stores body-shaped model parts simulated as figures of individual portions of a human body so as to constitute a plurality of body-shaped models simulated as figures of a plurality of human bodies mutually different in their figures. It is noted that since the present embodiment deals with a simulation, the body-shaped model parts denote design data representative of individual portions of a human body, which are designed on a three-dimensional basis.

A parts arrangement data storage unit 102 stores parts arrangement data to constitute body-shaped models within the simulation space by means of arranging the body-shaped model parts stored in the body-shaped model parts storage unit 101, in association with a plurality of postures of the body-shaped models, for example, a standing posture, a chair-sit-down posture and the like. The parts arrangement data defines a way of combining parts, for example, with respect to the chair-sit-down posture, a way of joints of parts such that a component representative of the leg and a component representative of the lap are perpendicularly combined, and the component representative of the lap and a component representative of the body are perpendicularly combined. The parts arrangement data are mutually different according to the posture of body-shaped models, but do not vary according to the figure of body-shaped models as far as the posture body-shaped models is the same. The parts arrangement data storage unit 102 also stores parts arrangement data to constitute body-shaped models involved in postures such that auxiliary instruments, such as a wheelchair and a crutch, are used. Further, the parts arrangement data storage unit 102 stores movable range data representative of movable ranges of body-shaped models in association with the respective postures of the body-shaped models.

An auxiliary instrument model storage unit 103 stores auxiliary instrument models representative of figures of the above-mentioned auxiliary instruments. The auxiliary instrument model storage unit 103 stores various types of auxiliary instrument models according not only to specific type of auxiliary instrument such as a wheelchair and a crutch, but also to figures of the body-shaped models such as a large-sized wheelchair, a middle-sized wheelchair, and small-sized wheelchair, even if the same type of auxiliary instrument is concerned.

A reference position storage unit 104 stores reference position data representative of a reference position of a body-shaped model in association with each of a plurality of postures of the body-shaped model, wherein when the body-shaped model is arranged in a simulation space, the reference position is defined in location within the simulation space regardless of a figure of the body-shaped model. The reference position will be described in detail later. With respect to a posture of a body-shaped model when an auxiliary instrument is used, the reference position storage unit 104 stores reference position data representative of a reference position of the body-shaped model the posture of which is involved in the use of the auxiliary instrument, and in addition reference position data representative of a reference position of an auxiliary instrument model in association with the reference position of the body-shaped model the posture of which is involved in the use of the auxiliary instrument.

A figure selection means 105 optionally selects a figure of a body-shaped model to be arranged in the simulation space, from among figures of a plurality of body-shaped models. For example, an operator may select the body-shaped model by the use of a keyboard, a mouse and the like.

When a certain figure of a body-shaped model is selected by the figure selection means 105, body-shaped model parts, which are necessary for constitution of the selected figure of the body-shaped model, are read out from among the body-shaped model parts stored in the body-shaped model parts storage unit 101, and then fed to a model layout means 107 which will be described later. Further, when a posture of a body-shaped model using an auxiliary instrument is selected by a posture selection means 106 which will be described later, an auxiliary instrument model, which is suitable for the selected posture and also suitable for the selected figure of the body-shaped model, is read out from among the auxiliary instrument models stored in the auxiliary instrument model storage unit 103, and then fed to the model layout means 107.

The posture selection means 106 optionally selects a posture of a body-shaped model to be arranged in a simulation space. For a selection of a posture of a body-shaped model, for example, a keyboard, a mouse and the like are used by an operator.

When a posture of a body-shaped model is selected by the posture selection means 106, parts arrangement data, which are associated with the selected posture, are read out from among the parts arrangement data stored in the parts arrangement data storage unit 102, and then fed to the model layout means 107. When the selected posture is involved in a posture using an auxiliary instrument, an auxiliary instrument model, which is associated with the selected posture and also the already selected figure of the body-shaped model, is read out from among the auxiliary instrument models stored in the auxiliary instrument model storage unit 103, and then fed to the model layout means 107. Further, read out from the reference position storage unit 104 and transmitted to the model layout means 107 are reference position data representative of a reference position of a body-shaped model in association with the selected posture, and in the event that the selected posture is involved in a posture using an auxiliary instrument, reference position data of the auxiliary instrument model as well.

The model layout means 107 receives simulation equipment models, which are simulated as figures of equipment as objects whose operability are to be evaluated. The simulation equipment models may each be on individual equipment model representative of a sole equipment, when a sole equipment is an object to be evaluated. On the other hand, the simulation equipment models may be equipment models representative of an assembly of a plurality of equipment which are subjected to a layout process in a predetermined arrangement, when the assembly of the plurality of equipment is an object to be evaluated.

The model layout means 107 is adapted to receive the above-mentioned various types of data, and arrange the equipment models in the simulation space and also arrange in the simulation space the body-shaped model selected by the figure selection means 105 in the posture selected by the posture selection means 106.

The model layout means 107 serves, when the body-shaped model arranged in the simulation space is altered by the figure selection means 105, to arrange a new body-shaped model instead of the body-shaped model before alteration in the simulation space in such a manner that a posture of the body-shaped model after alteration is the same as that of the body-shaped model before alteration, and in addition a reference position of the body-shaped model after alteration with the identical posture essentially coincides with a reference position of the body-shaped model before alteration with the identical posture. However, in the event that a posture using an auxiliary instrument is selected by the posture selection means 106 and a body-shaped model different in the figure is selected, as mentioned above, the selected model is altered to an auxiliary instrument model of a size suitable for the figure of the body-shaped model. In such a case, it happens that the body-shaped model before alteration and the body-shaped model after alteration do not coincide with each other in their reference position.

The model layout means 107 is also adapted, when the posture of the body-shaped model is altered by the posture selection means 106, to alter the posture of the body-shaped model arranged in the simulation space.

At that time, when the posture of the body-shaped model after alteration is concerned with the use of the auxiliary instrument, the suitable auxiliary instrument model is read from the auxiliary instrument model storage unit 103 to be fed to the model layout means 107. On the other hand, regardless of the fact that the posture of the body-shaped model after alteration is concerned with the use of the auxiliary instrument, parts arrangement data corresponding to the posture of the body-shaped model after alteration is read from the parts arrangement data storage unit 102 to be fed to the model layout means 107, and further reference position data corresponding to the posture of the body-shaped model after alteration is read from the reference position storage unit 104 to be fed to the model layout means 107. The model layout means 107 alters the body-shaped model arranged in the simulation space in the posture to that selected by the posture selection means 106 so that the reference position of the posture of the body-shaped model matches with a predetermined arrangement in the simulation space.

Fed to an image display unit 108 is data representative of the simulation space in such a state that equipment model and a body-shaped model (including an auxiliary instrument model) are arranged by the model layout means 107. The image display unit 108 essentially displays images looking from a view point different from a point of view of the body-shaped model in the simulation space in which equipment models and body-shaped models are arranged by the model layout means 107. It is assumed, however, that the image display unit 108 displays the simulation space looking from a point of view of the body-shaped model.

FIGS. 2(A) and (B) are illustrations showing a first example of images before and after an alteration of a body-shaped model. Here, there are shown images before and after the alteration to a body-shaped model different in a body form.

FIG. 2(A) is an illustration showing an example of an image before an alteration of a body-shaped model. In FIG. 2(A), there are shown equipment model 10, a body-shaped model 20 in standing posture, a visual field pattern 31 representative of a visual field area of a good sight looking from the body-shaped model 20, and a visual field pattern 32 representative of a visual field area of an indistinct sight looking from the body-shaped model 20. The visual field patterns 31 and 32 will be described later.

The body-shaped model 20 is of a standing posture. When it is concerned with the standing posture, a reference position is located at the bottom of the foot of the body-shaped model 20 which is arranged in the form of the standing posture at the position in such a state that the reference position (the bottom of the foot) is in contact with the floor. It is to be noted that while FIG. 2(A) shows the characters "ref. position" and also arrows indicative of coordinates given with the reference position as the origin of the coordinate axes, these are illustrated in FIG. 2(A) for the purpose of convenience of the explanation and do not appear on the screen. Similarly, the dotted lines coupling FIG. 2(A) with FIG. 2(B) do not appear on the screen. In the following figures too, in some cases, it happens that each of the figures includes characters and diagrams, which do not actually appear on the screen.

FIG. 2(B) is an illustration showing an example of an image after an alteration of a body-shaped model. In FIG. 2(B), there is arranged a body-shaped model of higher stature as compared with FIG. 2(A). When it is concerned with the standing posture, a reference position is located at the bottom of the foot of the body-shaped model 20 of higher stature after the alteration, which is arranged in such a manner that reference positions are coincident to each other before and after an alteration of a body-shaped model.

Figure 3:
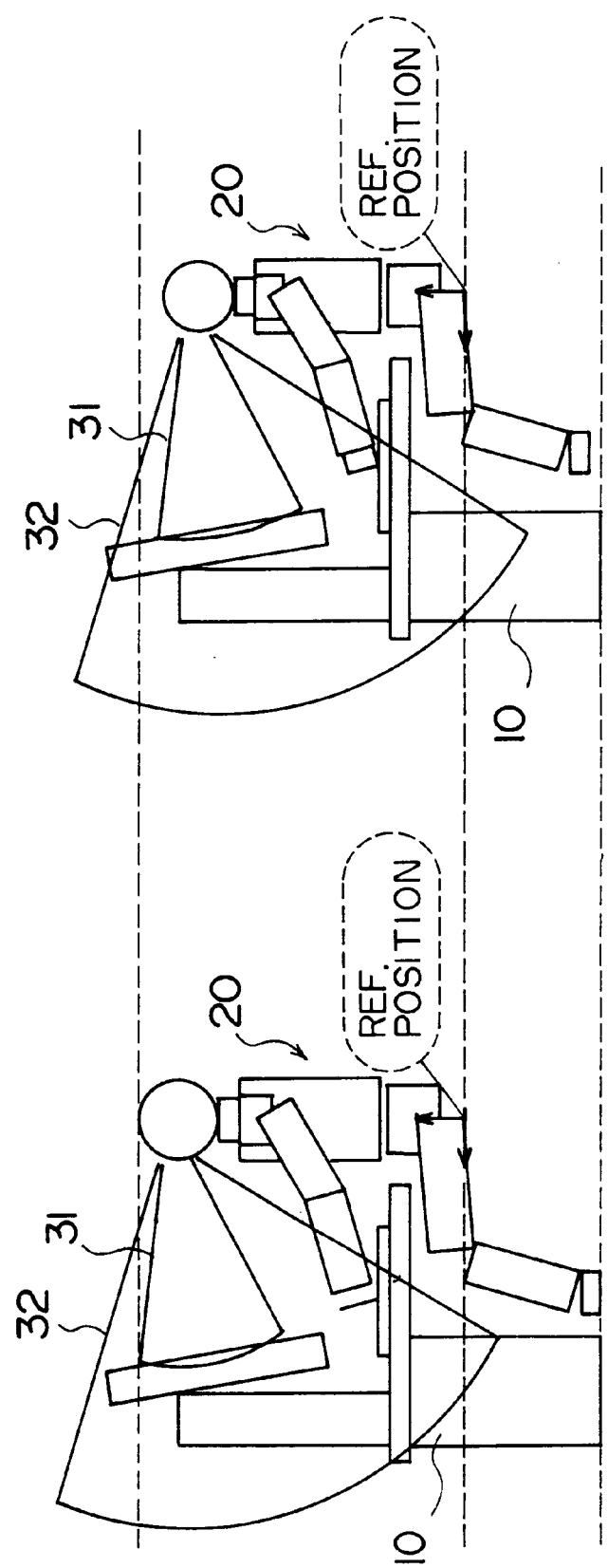
FIGS. 3(A) and 3(B) are illustrations showing a second example of images before and after an alteration of a body-shaped model.

FIGS. 3(A) and 3(B) are illustrations showing a second example of images before and after an alteration of a body-shaped model. Here, there are shown images before and after the alteration to a body-shaped model different in a body form in the posture of sitting on a chair.

In the case of the posture of sitting on a chair, a reference position is set up below the bottom, and a body-shaped model is altered in such a manner that reference positions before and after the alteration are coincident with each other regardless of a body form.

Figure 4:
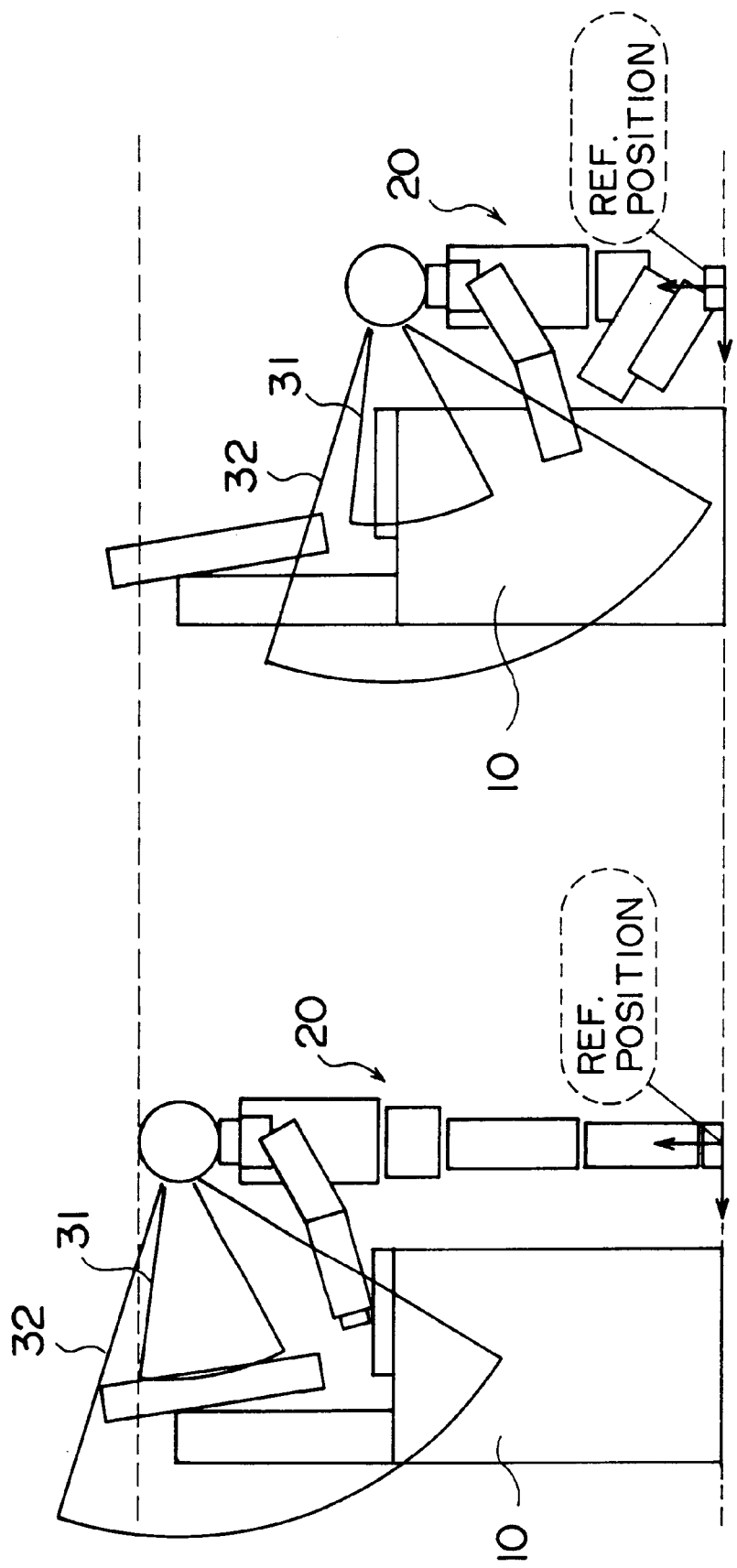
FIGS. 4(A) and 4(B) are illustrations showing a first example of images before and after an alteration of a posture.

FIGS. 4(A) and 4(B) are illustrations showing a first example of images before and after an alteration of a posture, which are displayed on an image display unit. FIGS. 4(A) and 4(B) show a standing posture and a squatting down posture, respectively. In this case, reference positions before and after the alteration are coincident with each other, but the visual field patterns 31 and 32 are altered in position.

Figure 5:
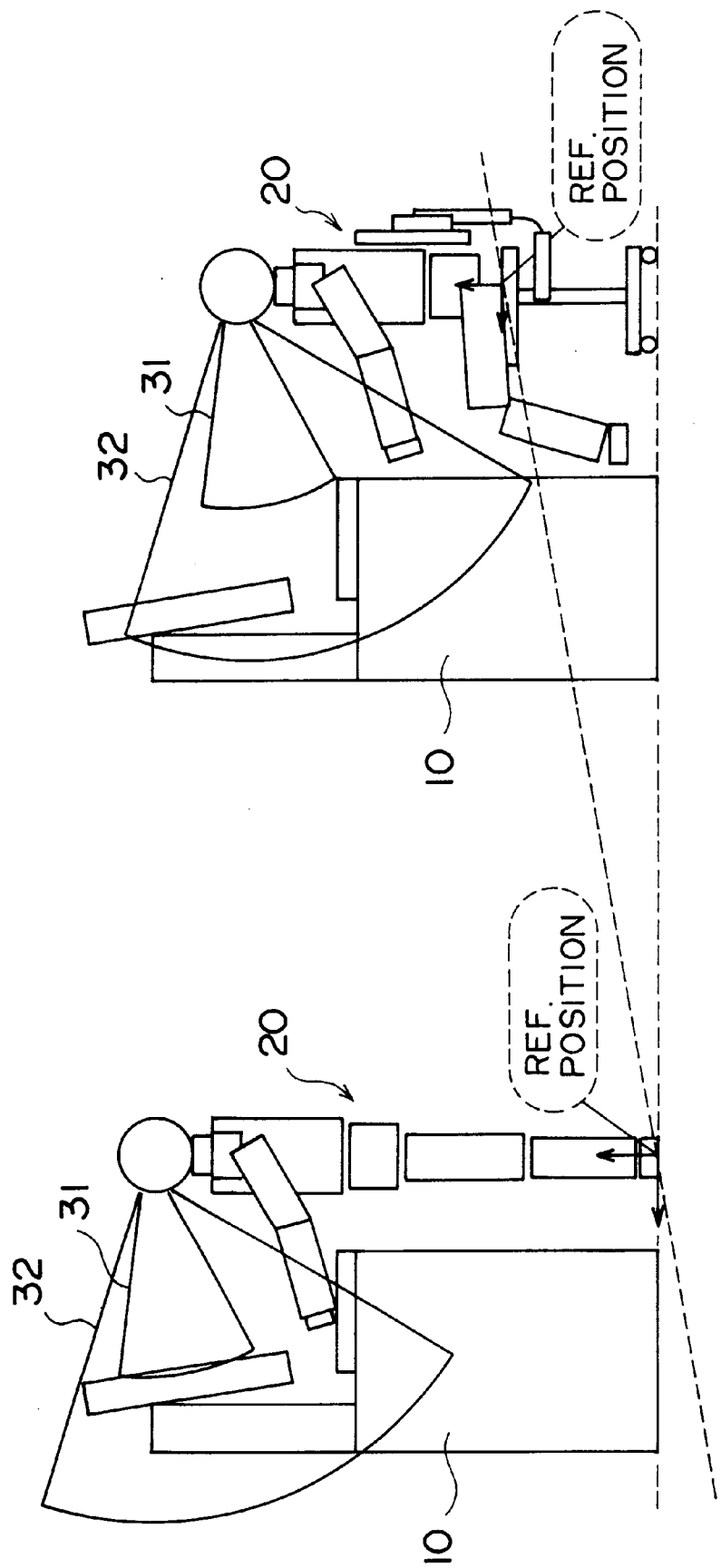
FIGS. 5(A) and 5(B) are illustrations showing a second example of images before and after an alteration of a posture.

FIGS. 5(A) and 5(B) are illustrations showing a second example of images before and after an alteration of a posture. FIGS. 5(A) and 5(B) show a standing posture and a posture sitting down on a chair, respectively. In this case, reference positions before and after the alteration are not coincident with each other.

Figure 7:
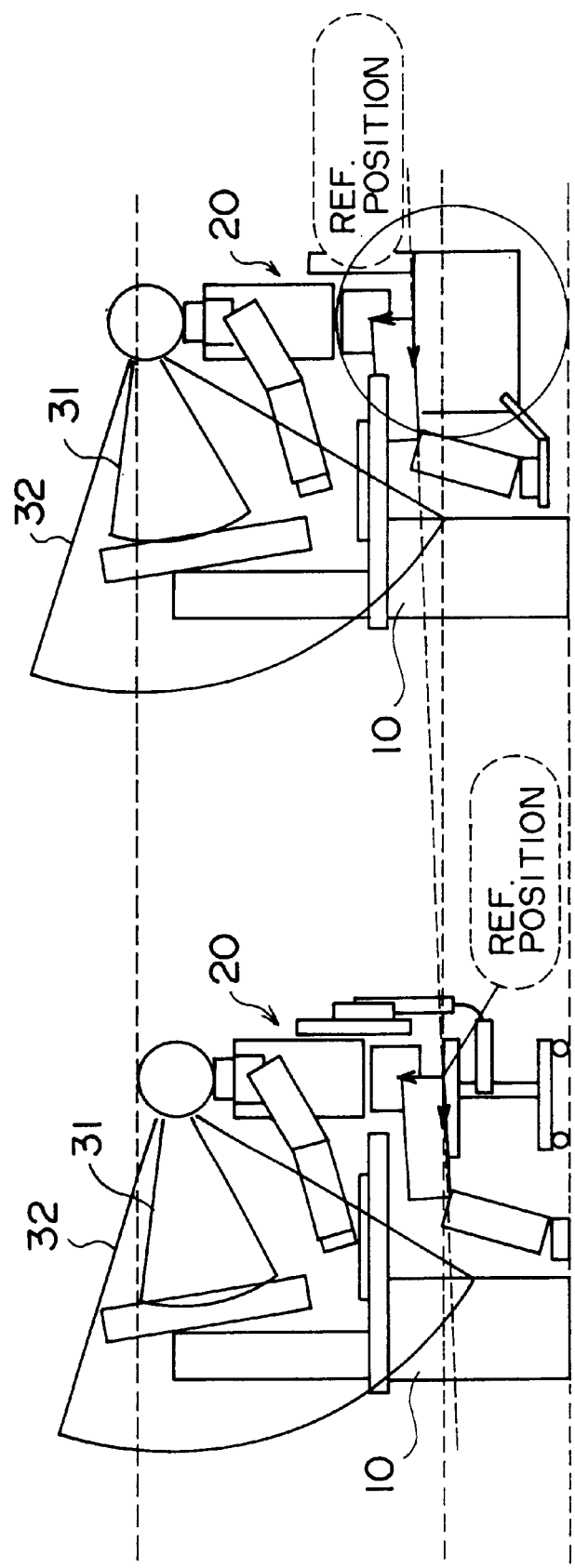
FIGS. 7(A) and 7(B) are illustrations showing movable ranges of images of body-shaped models according to postures of the body-shaped models.

FIGS. 7(A) and 7(B) are an illustrations showing a third example of images before and after an alteration of a posture. FIGS. 7(A) and 7(B) show a standing posture and a posture sitting down on a wheelchair, respectively. In this case, reference positions before and after the alteration are not coincident with each other.

Returning to FIG. 1, the explanation is continued. An action instruction means 109 instructs an action of a body-shaped model arranged by the model layout means 107 in the simulation space. The action instruction means 109 is, for example, a mouse, and performs an action instruction in such a manner that parts (e.g., an arm) of interest of the body-shaped model displayed on the image display unit 108 are subjected to selection and movement on an image screen.

When an action of the body-shaped model arranged in the simulation space is instructed by the action instruction means 109, the model layout means 107 enables an action of the body-shaped model arranged in the simulation space in accordance with the action instruction by the action instruction means 109. In case of this action, movable limit data representative of movable limits of each of the body-shaped models according to a posture of the body-shaped model arranged in the simulation space is read from the parts arrangement data storage unit 102 to be fed to the model layout means 107. Upon receipt of the action instruction of the body-shaped model by the action instruction means 109, the model layout means 107 causes the body-shaped model arranged in the simulation space to move within the movable limit according to the posture of the body-shaped model.

Figure 6:
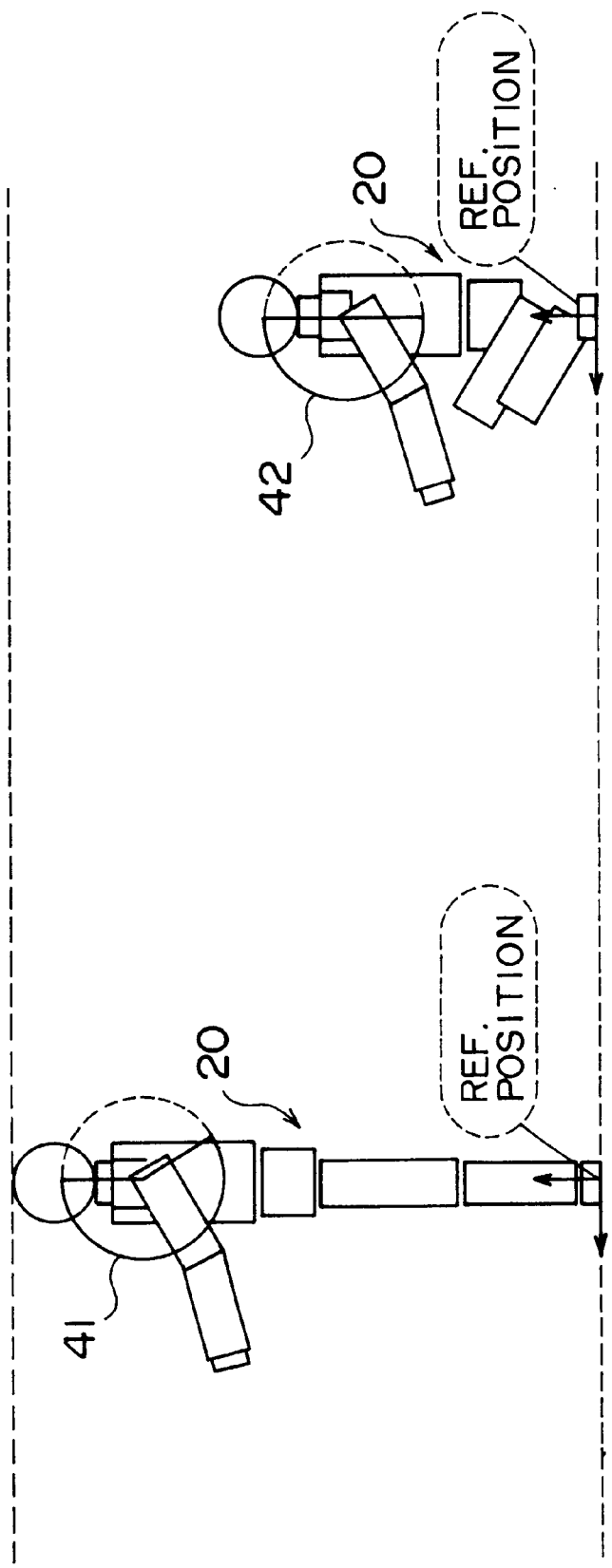
FIG. 6(A) an 6(B) are illustrations showing a third example of images before and after an alteration of a posture.

FIGS. 6(A) and 6(B) are illustrations showing movable ranges of images of body-shaped models according to postures of the body-shaped models. FIGS. 6(A) and 6(B) show a movable limit 41 of upper arms concerned with a standing posture and a movable limit 42 of upper arms concerned with a squatting down posture, respectively. As seen from this example, a movable range or limit of parts constituting the body-shaped model is varied in accordance with a posture of the body-shaped model.

Again, referring to FIG. 1, the apparatus 100 for supporting an evaluation of equipment operability has action evaluation means 110 for evaluating whether an action, which is indicated by the action instruction means 109 and is executed by the model layout means 107, is easy for a person taking into account movement, rate of travel and acceleration of travel involved in the action. This evaluation offers guidance for a final operability evaluation by an operator.

A visual field pattern storage unit 111 stores a visual field pattern representative of a visual field of a body-shaped model. The image display unit 108 displays a visual field pattern so as to represent a visual field of a body-shaped model appearing on an image screen to match a position of the eyes of the body-shaped model. The position of the visual field pattern displayed on the image screen is moved in the display when the head of the body-shaped model moves, so as to represent a visual field involved in the position of the head in cooperation with the movement of the head. According to the present embodiment, the visual field pattern storage unit 111 stores a plurality of stages of visual fields mutually different in degree of visibility. That is, the visual field pattern 31 representative of a visual field area concerned with a good sight looking from the body-shaped model, as shown in FIGS. 2–6, the visual field pattern 32 representative of a visual field area concerned with a not so good sight looking from the body-shaped model, as shown in FIGS. 2–6, and a visual field pattern (see visual field pattern 33 shown in FIGS. 8 and 9) representative of a visual field area noticed by the body-shaped model, which is not shown in FIGS. 2–6.

A visual field selection means 112 optionally selects visual fields for a display from among a plurality of stages of visual fields mutually different in degree of visibility, which are stored in the visual field pattern storage unit 111, permitting a simultaneous selection of a plurality of stages of visual fields using, for example, a mouse or a keyboard.

When the visual field selection means 112 selects a visual field for a display, the image display unit 108 displays a visual field pattern representative of the visual field selected by the visual field selection means 112 to match a position of the eyes of the body-shaped model displayed on the image screen. The position of the displayed visual field pattern is moved in the display in cooperation with the movement of the head of the body-shaped model.

Figure 8:
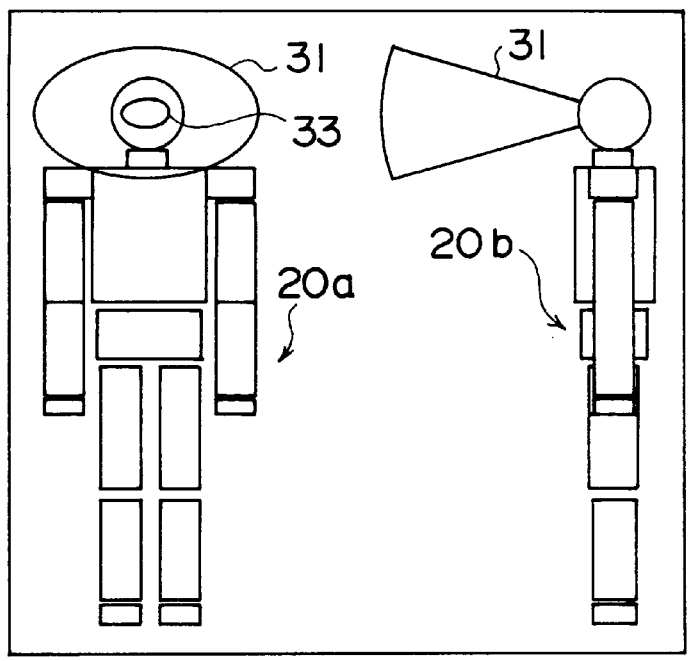
FIG. 8 is an illustration showing a first example of images in which a figure of a visual field is added to a body-shaped model.
Figure 9:
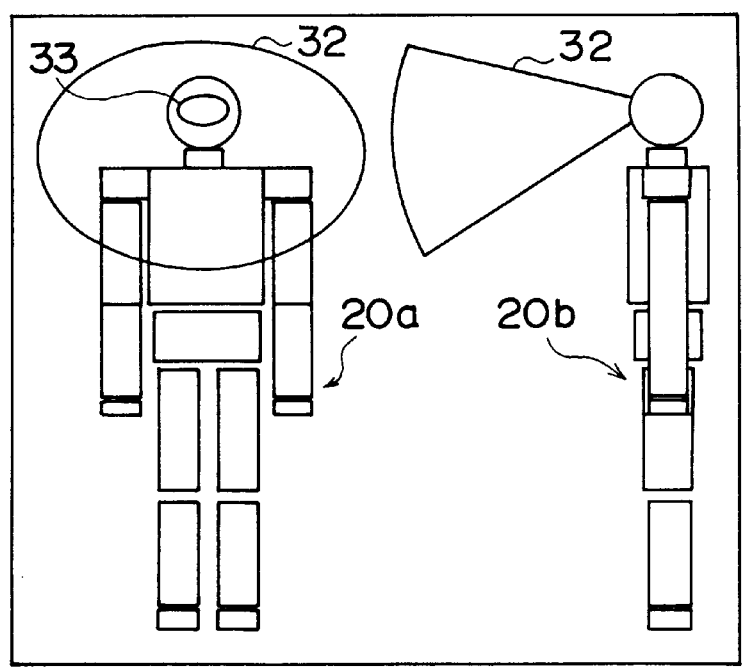
FIG. 9 is an illustration showing a second example of images in which a figure of a visual field is added to a body-shaped model.

FIG. 8 is an illustration showing a first example of images in which a figure of a visual field is added to a body-shaped model. FIG. 9 is an illustration showing a second example of images in which a figure of a visual field is added to a body-shaped model. Both of the illustrations of FIGS. 8 and 9 show a body-shaped model 20a looking from the front and a body-shaped model 20b looking from the side.

With respect to the body-shaped model 20a looking from the front shown in FIG. 8, there are shown a visual field area 31 concerned with a good sight looking from the body-shaped model 20a, and a visual field area 33 noticed by the body-shaped model 20a. With respect to the body-shaped model 20b looking from the side shown in FIG. 8, there is shown a visual field area 31 concerned with a good sight looking from the body-shaped model 20a. Further, with respect to the body-shaped model 20a looking from the front shown in FIG. 9, there are shown a visual field area 32 concerned with an indistinct sight looking from the body-shaped model 20a, and a visual field area 33 noticed by the body-shaped model 20a. With respect to the body-shaped model 20b looking from the side shown in FIG. 9, there is shown a visual field area 32 concerned with an indistinct sight looking from the body-shaped model 20b. Incidentally, in FIGS. 2–5 and 7, there are shown a visual field area 31 concerned with a good sight looking from the body-shaped model 20, and a visual field area 32 concerned with a indistinct sight looking from the body-shaped model 20.

Further, with respect to images looking from a viewpoint of a body-shaped model arranged in the simulation space, the visual field selection means 112 optionally selects visual field limits for a display from among a plurality of stages of visual field limits looking from a viewpoint of the body-shaped model, permitting a simultaneous selection of a plurality of stages of visual field limits. Incidentally, according to the present embodiment, the visual field pattern storage unit 111 stores therein data representative of a three-dimensional visual field figure also used for a collision check which will be described later. A visual field figure or pattern displayed on the image screen looking from a viewpoint of a body-shaped model, and a visual field figure or pattern displayed on the image screen looking from a viewpoint other than the viewpoint of the body-shaped model, are plotted on the basis of the data representative of a three-dimensional visual field figure.

The image display unit 108 is adapted, as mentioned above, to display an image looking from a viewpoint of a body-shaped model arranged in a simulation space, and thus displays on an image screen looking from a viewpoint of a body-shaped model a visual field pattern representative of one stage or a plurality of stages of visual field limits selected by the visual field selection means 112. The displayed visual field pattern is linked in its movement to a movement of the head of the body-shaped model arranged in a simulation space.

FIGS. 10(A) and 10(B) are views showing an example of a display of a figure of a visual field. FIG. 10(A) is a view showing an example of a display of visual field patterns 31 and 32 on an image screen when looking at a simulation space from a viewpoint different from that of the body-shaped model 20. FIG. 10(B) is a view showing an example of a display of a visual field pattern 31 representative of a visual field limit concerned with a good sight looking from the body-shaped model, and a visual field pattern 32 representative of a visual field limit concerned with an indistinct sight looking from the body-shaped model, on an image screen when looking at a simulation space from a viewpoint of the body-shaped model.

In this manner, when a visual field pattern representative of a visual field limit is displayed on an image screen looking from a viewpoint of the body-shaped model, an operator can grasp the visual field limit concerned with a sight looking from the body-shaped model in association with a visibility. Thus, it is possible to implement a more suitable operability evaluation.

Referring to FIG. 1, the explanation is continued. The apparatus 100 for supporting an evaluation of equipment operability has further an eyeball motion instructing means 113 which uses a keyboard or a mouse, as does the figure selection means 105, the posture selection means 106 and the visual field selection means 112.

The eyeball motion instructing means 113 instructs a movement of the eyeballs of the body-shaped model arranged in the simulation space. When the eyeball motion instructing means 113 instructs a movement of the eyeballs, the image display 108 moves a visual field pattern indicative of a point to be closely observed to which the eyeballs of the body-shaped model are directed, of the visual field patterns displayed on the image screen looking from a viewpoint of the body-shaped model, in accordance with an instruction of the eyeball motion.

Figure 11B:
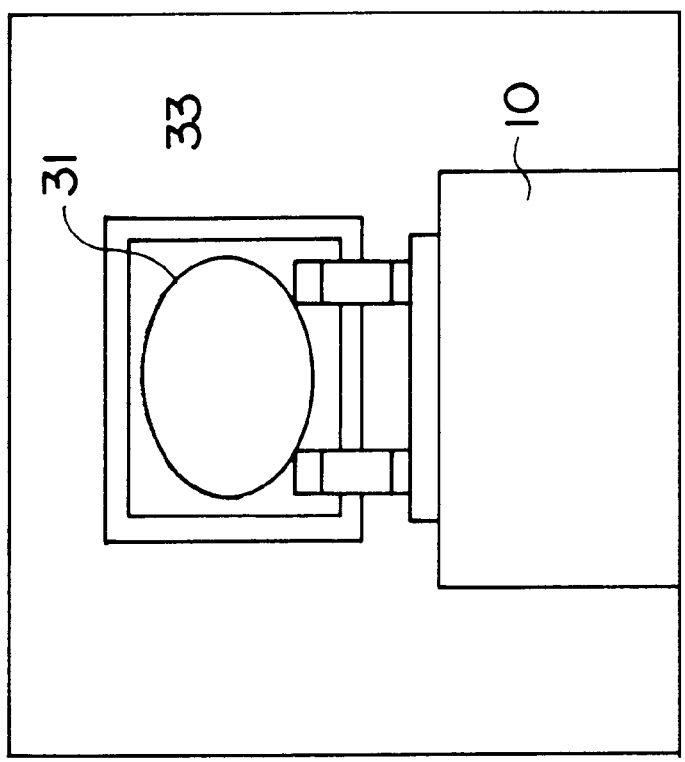
FIGS. 11A) and 11(B) are views showing an example of a display of a figure of a visual field.
Figure 11A:
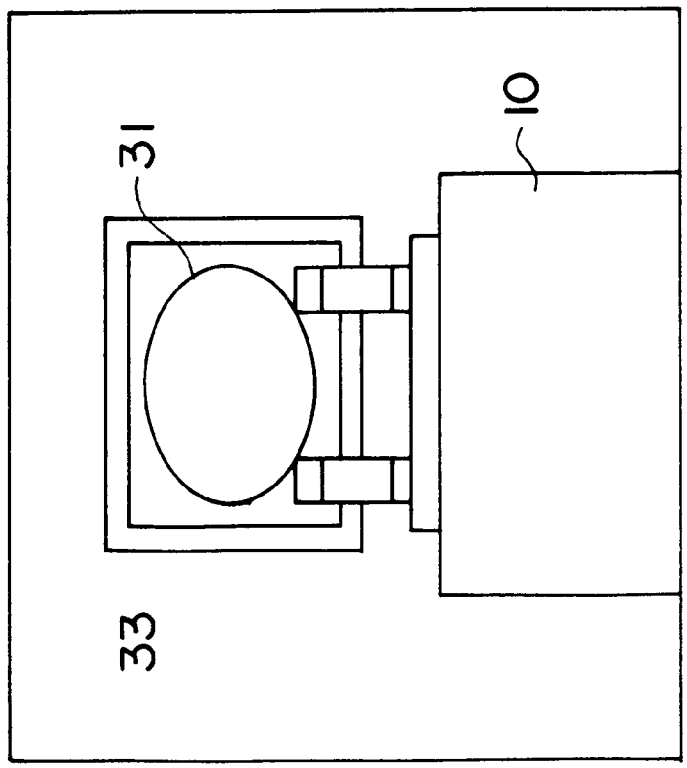

FIGS. 11(A) and 11(B) are views showing an example of a display of a figure of a visual field. FIG. 11(A) is a view showing an example of a display of visual field pattern 31 representative of a visual field limit concerned with a good sight, and a visual field pattern 33 representative of a visual field limit noticed by the body-shaped model before the eyeball movement, on an image screen when looking from a viewpoint of the body-shaped model. FIG. 11(B) is a view showing an example of a display of a visual field limit concerned with a good sight, and a visual limit concerned with a good sight, and a visual field pattern 33 representative of a visual field limit noticed by the body-shaped model after the eyeball movement, on an image screen when looking from a viewpoint of the body-shaped model.

As shown in FIGS. 11(A) and 11(B), according to the present embodiment, the visual field pattern 33 representative of a visual field limit noticed by the body-shaped model is moved in accordance with an instruction of the eyeball motion. Consequently, it is possible to know whether a desired point can be observed closely through only a movement of eyeballs, or a desired point only can be observed closely when the head is moved, for instance. Thus, it will be useful for evaluation of operability.

Again, referring to FIG. 1, the apparatus 100 for supporting an evaluation of equipment operability has a visual field in and out determination means 114 for determining whether equipment model arranged in a simulation space exists in a visual field of the body-shaped model arranged in the same simulation space. According to the present embodiment, there is assumed a solid visual field of a body-shaped model. And when the visual field in and out determination means 114 makes the above-mentioned determination, it is determined whether the solid visual field configuration and the equipment model collide with one another (distance: 0, or interference). With respect to the collision determination, there are known various schemes, and it is possible to use the schemes as proposed in, for example, "Lecture Paper pp. 373–374, 13th Lecture Meeting of the Robotics Society of Japan" and "Lecture Paper pp. 53–54, 51st National Lecture Meeting of Information Processing of Japan."

According to the present embodiment, there is adopted, as a solid visual field configuration representative of a visual field of a body-shaped model, a solid configuration having a finite distance (e.g., within 1.0 m) from a viewpoint of the body-shaped model. Consequently, also in a case where the finite distance exceeds 1.0 m, it is determined to be out of the visual field. For the solid visual field configuration, it is either acceptable to adopt a solid configuration representative of a visual field limit concerned with a good sight looking from the body-shaped model, or a solid configuration representative of a visual field limit concerned with an indistinct sight looking from the body-shaped model, in accordance with an object. It is preferable, however, to provide such an arrangement that a plurality of solid configurations each representing an associated one of a plurality of visual fields mutually different in degree of the visibility are prepared so that a desired one can be optionally selected by the visual field selection means 112 for instance.

A determination result by the visual field in and out determination means 114 is transmitted to the image display unit 108 to display the same on the image screen. When the determination result is displayed on the image screen, an object is identified as being out of the visual field in its entirety, partly inside the visual field, or inside the visual field in its entirety, by means of, for example, color identification, luminance, sort of lines or the like. Alternatively, to discriminate the inside and outside of the solid figure representative of the visual field limit on a binary basis, Boolean operations and the like may be executed for evaluating a union or a product set of solid figure-to-solid figure.

Again, referring to FIG. 1, the apparatus 100 for supporting an evaluation of equipment operability has an object designation means 115 for optionally designating an object appearing on the image screen of the image display unit 108, for example, a display unit, a switch, a lamp, or the equipment to be evaluated.

A distance calculation means 116 calculates a distance (a visual range) between an object designated by the object designation means 115, for example, the display unit, the switch and the like in a simulation space, and a viewpoint of the body-shaped model arranged in the same simulation space. The visual range is also one of factors which greatly contributes to the operability.

A visibility determination means 117 determines whether an object in a simulation space, which is designated by the object designation means 115, is visible for a body-shaped model arranged in the simulation space, through a motion in a movable limit according to a posture (e.g., a posture sitting on a chair) in the simulation space. The movable limits of parts of body-shaped models according to postures are stored, as mentioned above, in the parts arrangement data storage unit 102 together with parts arrangement data according to postures, of parts of body-shaped models.

In the event that a body-shaped model is moved to observe the designated object closely, if no request occurs especially from an operator, it is determined by means of movements of eyeballs, the head and the upper part of the body-shaped model whether the object can be observed closely. For a calculation of the state available for observing the object closely, there may be adopted a technology referred to as inverse kinematics, which is often used in the field of a robot. Here, a careful watching or a close observation is attempted by means of moving a certain segment. In that case, if it is difficult to closely observe the segment even if the segment is moved within a movable limit, the next segment is moved to again attempt to closely observe the segment.

For example, when an object, which is located obliquely behind with respect to a height of the eyeball position of the body-shaped model, first, a close observation is attempted by means of rotating the head on its vertical axis, and if it is difficult to closely observe the segment, then the close observation is again attempted by means of rotating the upper part of the body-shaped model on its vertical axis. When the object is arranged in such a delicate positional relation, whether the object can be closely observed only through an eye movement, a close observation by the eye movement is attempted before a rotation of the head. However, when it is clear that the object cannot be closely observed only through an eye movement, usually, the close observation by the eye movement is not attempted, and first, the head is rotated.

When the visibility determination means 117 determines that the designated object is visible for a body-shaped model, a result of the determination is transmitted to the distance calculation means 116 in which a visual range is calculated between the designated object and a viewpoint of the body-shaped model in the operational stage determined as being visible. A determination of the visual range as well as a determination of the visibility or possibility of the close observation makes it possible to provide an evaluation with greater accuracy.

Again, referring to FIG. 1, the apparatus 100 for supporting an evaluation of equipment operability has an area index pattern storage means 118 for storing area index patterns each indicative of a work possible area of a body-shaped model in the simulation space in association with the respective postures of each of the body-shaped models. The image display unit 108 displays an area index pattern indicative of a work possible area involved in the posture of a body-shaped model appearing on the image screen to match a position or the like of an arm of the body-shaped model.

As mentioned above, the body-shaped model in the simulation space can be moved by an instruction from the action instruction means 109, and it is possible to determine whether certain work is possible through the action. In this case, there is a need to provide an operation that moves the body-shaped model. On the other hand, the area index pattern is a figure indicative of an operable area of the body-shaped model on the assumption that the body-shaped model is moved. Thus, it is possible to apparently visually recognize an operable area of the body-shaped model without a need to move the body-shaped model each time, thereby contributing to an improvement of the efficiency of the operability evaluation.

According to the present embodiment, the area index pattern storage means 118 stores therein a plurality of area index patterns indicative of a plurality of stages of work possible areas mutually different in working property in accordance with a body-shaped model and its posture. Using a keyboard or a mouse, a work possible area selection means 119 selects work possible areas for a display, permitting a simultaneous selection of a plurality of stages of work possible areas, from among the plurality of stages of work possible areas mutually different in working property, which are stored in the area index pattern storage means 118.

When the work possible area for a display is selected by the work possible area selection means 119, the image display unit 108 displays an area index pattern indicative of the work possible area, selected by the work possible area selection means 119, of the body-shaped model appearing on the image screen.

The area index pattern displayed on the image screen is altered, as a posture of the body-shaped model arranged in the simulation space is altered, from the area index pattern for the body-shaped model concerned with a posture before an alteration to an area index pattern for the body-shaped model concerned with a posture after an alteration, because the work possible area is varied in accordance with the posture, even if it is concerned with the same level of working property.

Figure 12:
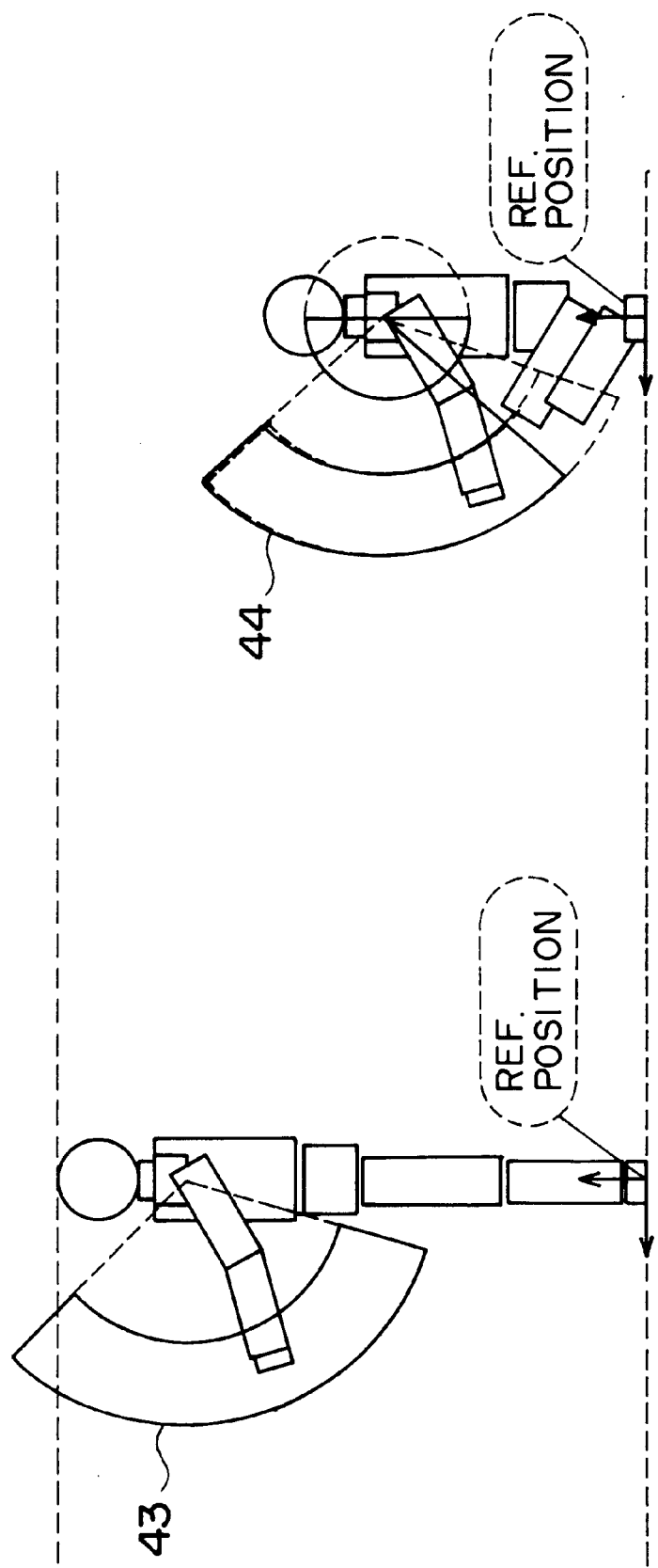
FIGS. 12(A) and 12(B) are illustrations of an example of images in which an index figure for a work possible area is added to a body-shaped model.
Figure 13:
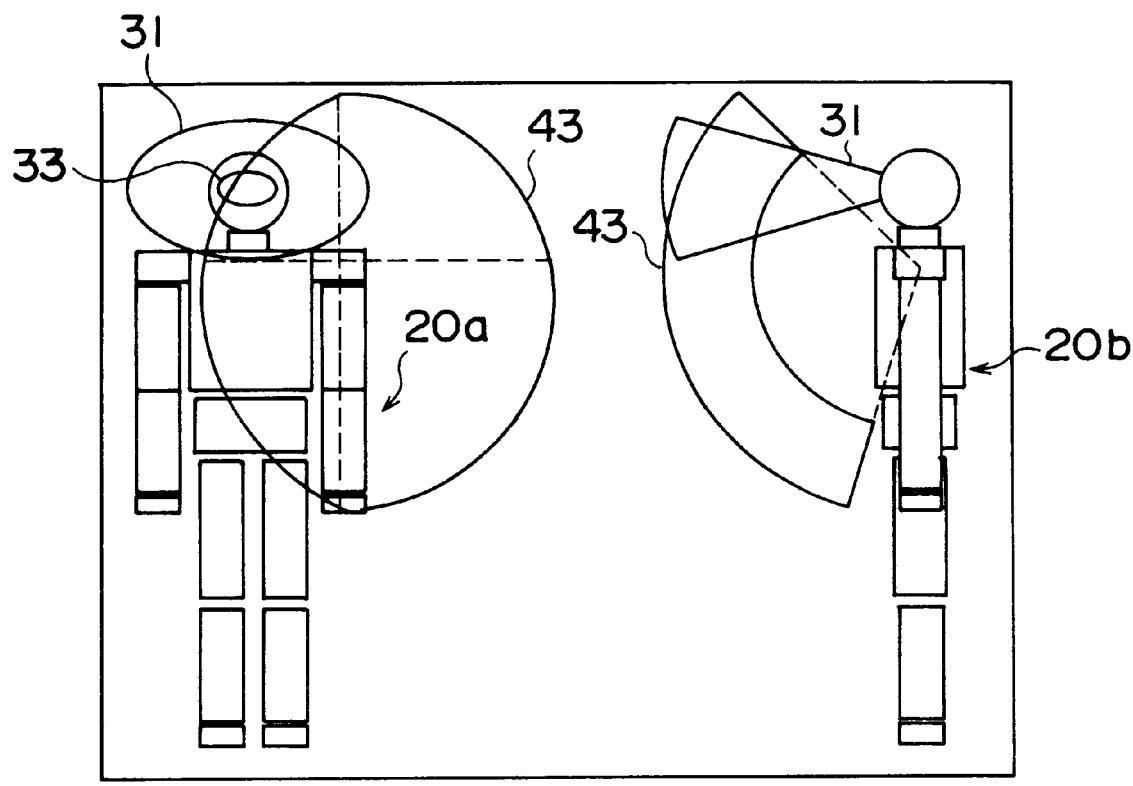
FIG. 13 is an illustration of an example of images in which both a figure of a visual field and an index figure for a work possible area are added to a body-shaped model.

FIGS. 12(A) and 12(B) are illustrations of an example of images in which an index figure for a work possible area is added to a body-shaped model. FIGS. 12(A) and 12(B) show work possible areas 43 and 44 for handwork in the form of a standing posture and a squatting posture, respectively. As will be seen from this example, even if it is concerned with the same site of the body, the work possible area is different depending on the posture of the body-shaped model. FIG. 13 is an illustration of an example of images in which both a figure of a visual field and an index figure for a work possible area are added to a body-shaped model looking from the front and the side. According to the present embodiment, as shown in FIG. 13, the visual field area and the work possible area are added to the body-shaped model and then displayed. Thus, it is possible to roughly perform an operability evaluation without moving the body-shaped model every time. Consequently, it is sufficient for the body-shaped model that only unknown portions are operated for an observation. Thus, it is possible to perform an operability evaluation excellent in efficiency.

Figure 14:
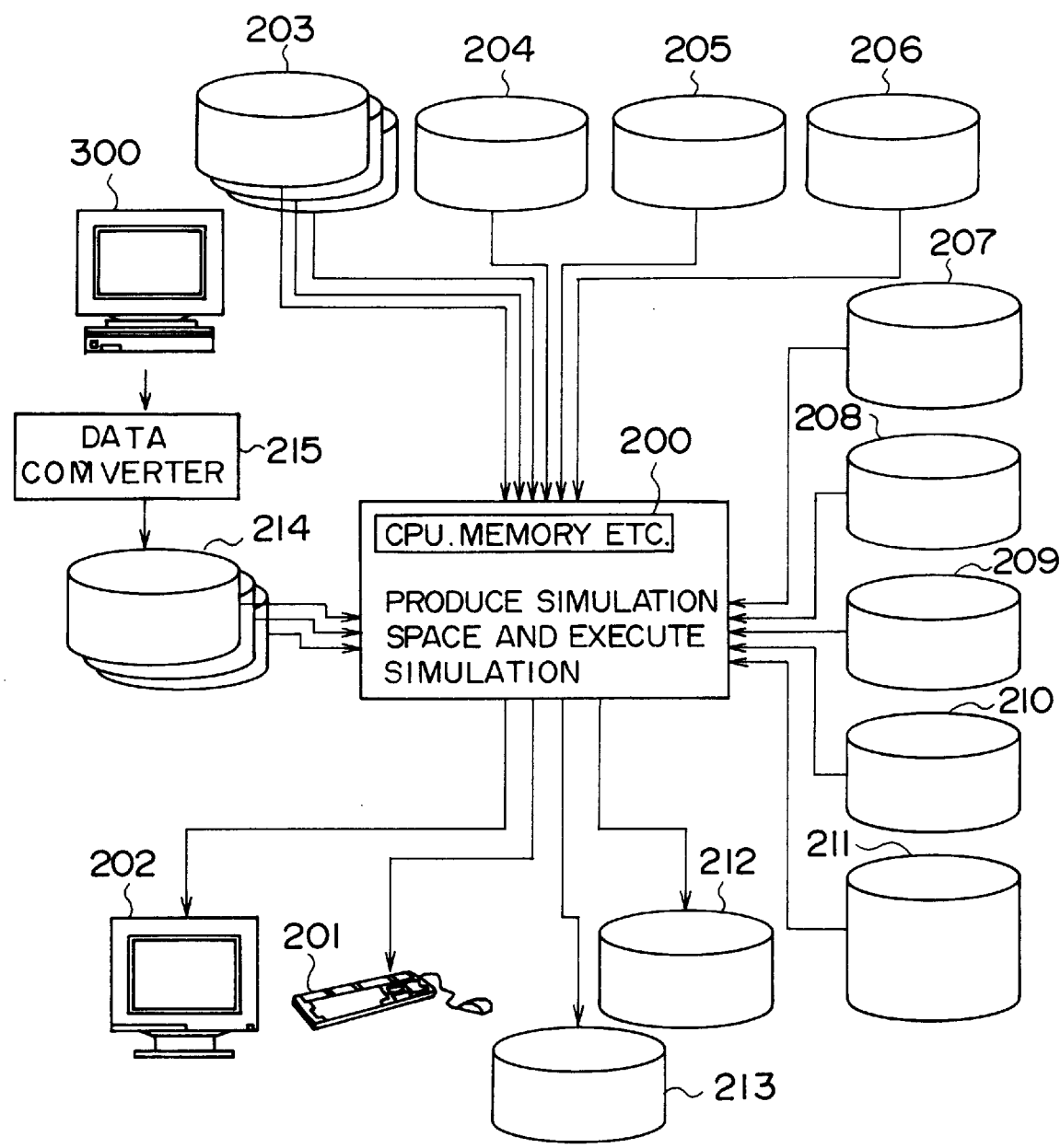
FIG. 14 is a schematic diagram showing a functional structure of an apparatus for supporting an evaluation of equipment operability according to another embodiment of the present invention;, FIGS. 15–18 display a flowchart useful for understanding a partial flow of a program to be executed in an arithmetic section in the functional structure of the apparatus shown in FIG. 14.

FIG. 14 is a schematic diagram showing a functional structure of an apparatus for supporting an evaluation of equipment operability according to an alternative embodiment of is the present invention. Here, there will be explained the embodiment in which the apparatus according to the present invention is implemented with a computer system.

The apparatus has an operation unit 200 which produces a simulation space and executes a simulation. On a hardware, the operation unit 200 serves as all ones for operating figures or patterns to be displayed in the form of images, but a function of actually displaying images, of the model layout means 107, the action evaluation means 110, the distance calculation means 116, the visibility determination means 117, the visual field in and out determination means 114, and the image display unit 108, which are referred to in the embodiment shown in FIG. 1.

The apparatus according to the embodiment shown in FIG. 14 has further an input device 201, such as a keyboard and a mouse, and an output device 202 such as a monitor. On a hardware, the input device 201 serves as all of the figure selection means 105, the posture selection means 106, the action instruction means 109, the visual field selection means 112, the eyeball motion instructing means 113, the object designation means 115, and the work possible area selection means 119. The output device 202 serves as a functional part of actually outputting images, of functions of the image display means 108 shown in FIG. 1.

The apparatus according to the embodiment shown in FIG. 14 has further a plurality of files 203–214 for storing various types of data and tables. Hereinafter, each of those files will be described.

The file 203 stores therein shape data of body-shaped model parts to constitute a plurality of body-shaped models mutually different in a body form. The file 203 corresponds to the body-shaped model parts storage unit 101 shown in FIG. 1.

The file 204 stores therein data groups each representative of a visual field shape. The file 204 corresponds to the visual field pattern storage unit 111 shown in FIG. 1.

The file 205 stores therein data groups each representative of a shape of a work area. The file 205 corresponds, in combination with the file 209 which will be described latter, to the area index pattern storage unit 118 shown in FIG. 1.

The file 206 stores therein data groups each representative of a shape of an auxiliary instrument such as a wheelchair. The file 206 corresponds to the auxiliary instrument model storage unit 103 shown in FIG. 1.

The file 207 stores therein arrangement data of body-shaped model parts, which indicates such a matter that parts of the lap are arranged next to parts of the knee, and movable limit data of parts, which indicates a relative movable limit angle between the parts of the knee and the parts of the lap. The file 207 corresponds, in combination with the file 208 which will be described next, to the parts arrangement data storage unit 102 shown in FIG. 1.

The file 208 stores therein a basic posture table to define a basic posture of a body-shaped model, for example, a standing posture, a posture of sitting on a chair, a squatting posture and the like. What is meant by defining a posture is that an angle between parts or segments to be connected to one another is defined, for example, in case of the standing posture, in such a manner that the segment of the knee and the segment of the lap are in line, and in case of the posture of sitting on a chair, in such a manner that the segment of the knee and the segment of the lap are coupled with each other in a relation of right angle. The file 208 corresponds, in combination with the file 207, to the parts arrangement data storage unit 102 shown in FIG. 1.

The file 209 stores therein a table indicative of a relation between the posture and the work area. The posture includes not only the basic posture, such as a standing posture, a posture of sitting on a chair, a squatting posture and the like, but also various postures involved in the situation that a body-shaped model acts in the basic posture. The reason why this is to do so is that the work area varies in accordance with such various postures as mentioned above. The shape itself representative of the work area is stored in the file 205. The file 209 corresponds, in combination with the file 205, to the area index pattern storage unit 118 shown in FIG. 1.

The file 210 stores therein a table indicative of a relation between, the posture, the auxiliary instrument and the like, and the reference position. The file 210 corresponds to the reference position storage unit 104 shown in FIG. 1.

The file 211 stores therein data indicative of an association of movement, rate of travel and acceleration of travel on each body-shaped model part with the evaluating points. The data stored in the file 211 is referred to when the movement of a body-shaped model is evaluated. While this data is not illustrated in FIG. 1, it is included in the action evaluation means 110 shown in FIG. 1.

The file 212 stores therein an evaluation result as to the movement of a body-shaped model, which is obtained when the data stored in the file 211 is referred to. The evaluation result is referred to when operability of equipment is evaluated.

The file 213 stores therein data of the movement of a body-shaped model in the form of a processing history. The data stored in the file 213 is used when the movement of the body-shaped model is reproduced for the purpose of the detailed investigation.

The file 214 stores therein data representative of equipment model, the data consisting of product shape data, product construction data, parts arrangement data and the like, which are generated by a three-dimensional CAD system 300 different from the apparatus for supporting an evaluation of equipment operability shown in FIG. 14, through converting by a data converter 215 into the data format suitable for the apparatus for supporting an evaluation of equipment operability.

FIGS. 15–18 are flowcharts useful for understanding a partial flow of a program to be executed in an arithmetic section in the functional structure of the apparatus shown in FIG. 14.

Figure 15:
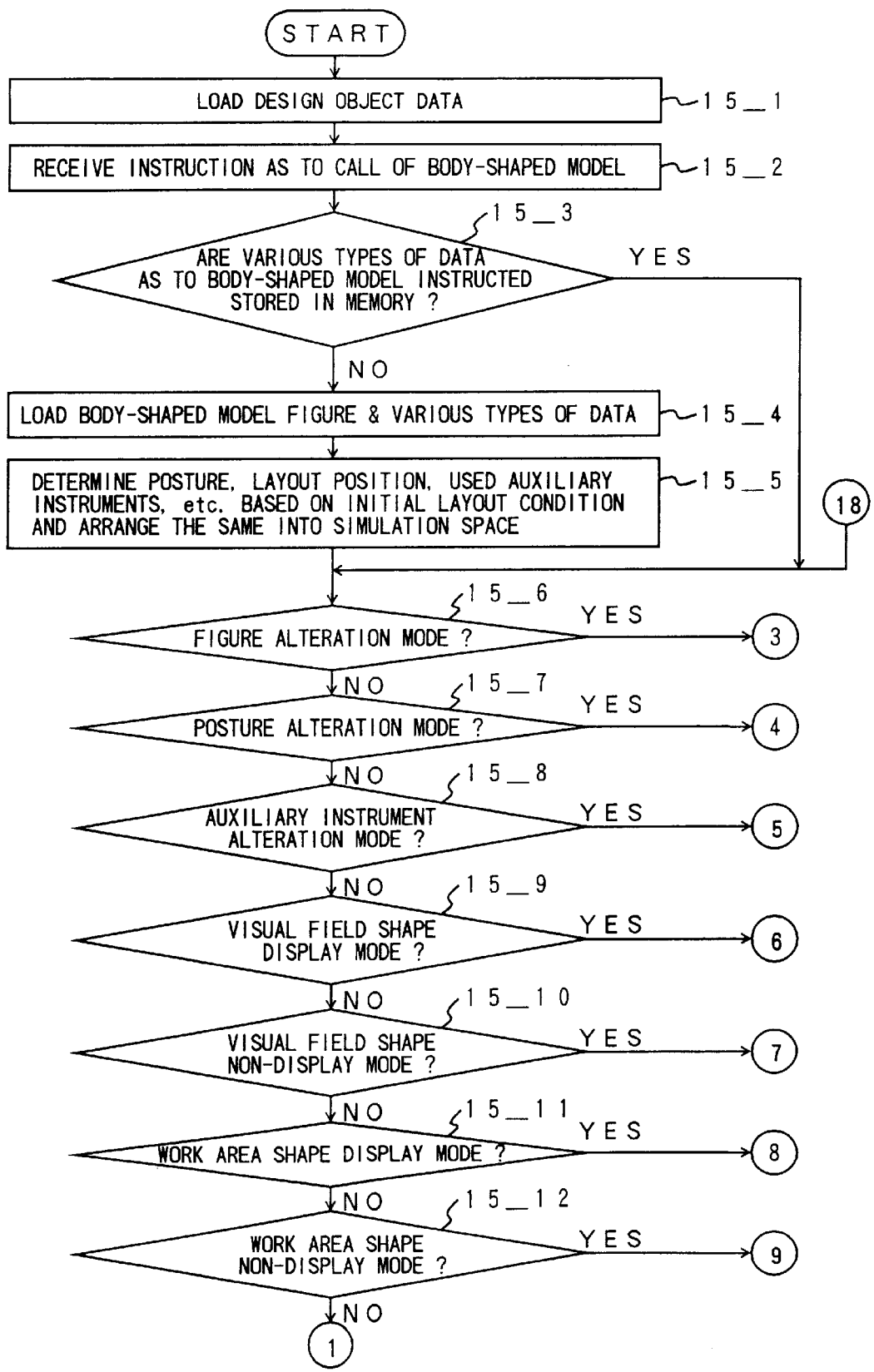

First, in step 15_1 shown in FIG. 15, data representative of a design object, for example, a single equipment, or a plurality of equipment as layout design objects, is read from the file 214 into the operation unit 200. Step 15_2 involves waiting for an instruction of calling a body-shaped model from an operator. When the operator indicates a specified body-shaped model or a body-shaped model designated as a default, the process goes to step 15_3 in which it is determined as to whether various types of data related to the indicated body-shaped model already exist in an internal memory of the operation unit 200. If such various types of data do not exist in the memory, then the process goes to step 15_4 in which the body-shaped model shape and other various types of data, related to the indicated body-shaped model, are loaded in its entirety from the file 203 shown in FIG. 14 and other files into the memory. In step 15_5, a posture of the body-shaped model, an arrangement position, an auxiliary instrument used and the like are determined on the basis of the initial arrangement condition to arrange the body-shaped model in the simulation space.

Figure 16:
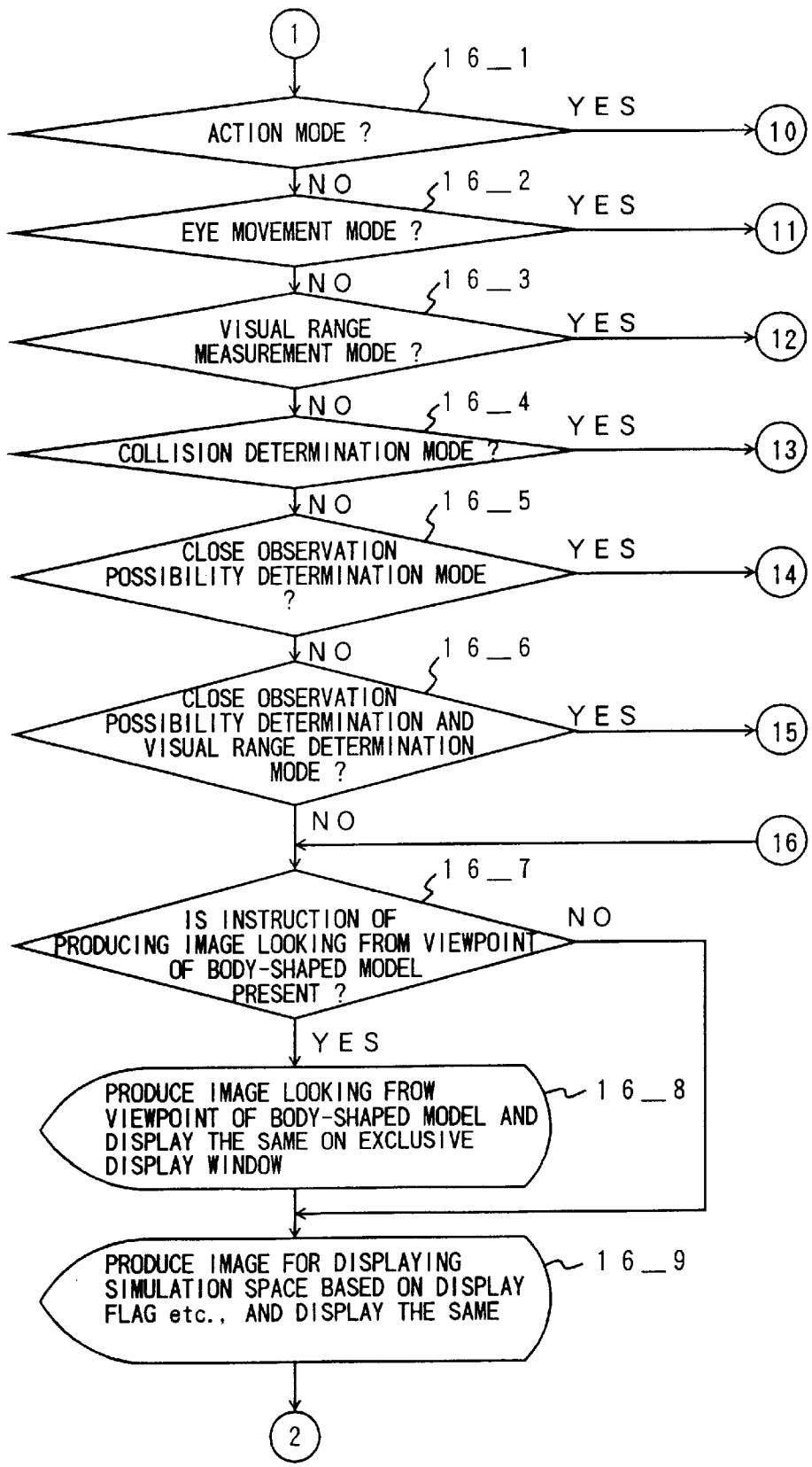

In steps 15_6 to 15_12 shown in FIG. 15 and steps 16_1 to 16_6 shown in FIG. 16, it is determined whether the present mode concerns a body form alteration mode (step 15_6); a posture alteration mode (step 15_7); an auxiliary instrument alteration mode (step 15_8); a visual field shape display mode (step 15_9); a visual field shape non-display mode (step 15_10); a work area shape display mode (step 15_11); a work area shape non-display mode (step 15_12); an operating mode (step 16_1); an eye movement mode (step 16_2); a visual range measurement mode (step 16_3); a collision determination mode (step 16_4); a close observation possibility determination mode (step 16_5); and a close observation possibility determination and visual range measurement mode (step 16_6), respectively. When it is determined that the present mode concerns the respective mode, the process goes to the associated one of the flows shown in FIGS. 19 to 31. The flows shown in FIGS. 19 to 31 will be described later. The determination as to whether the present mode is concerned with the respective mode is performed by referring to a flag indicative of the respective mode.

When the present mode is not any one of these respective modes, or in the event that the present mode is any one of these respective modes, after the associated one of the flows shown in FIGS. 19–31 is executed, the process goes to step 16_7 where it is determined whether there exists an instruction as to an image formation looking from a viewpoint of a body-shaped model. When it is determined that there exists an instruction as to an image formation looking from a viewpoint of a body-shaped model, an image looking a from a viewpoint of a body-shaped model is formed and the formed image is displayed on an exclusive display window which is formed on a display screen of the output device 202, and then the process goes to step 16_9.

In step 16_7, when it is determined that there exists no instruction as to an image formation looking from a viewpoint of a body-shaped model, the process skips step 16_8 and goes directly to step 16_9. In step 16_9, an image looking from a viewpoint other than the viewpoint of a body-shaped model is formed on the basis of a display flag and the like for the purpose of displaying a simulation space, and is displayed on the output device 202. The display flag will be described later.

In effect, in steps 16_7 to 16_9, the image looking from a viewpoint other than the viewpoint of a body-shaped model is formed and displayed regardless of the presence or absence of the instruction as to an image formation looking from a viewpoint of a body-shaped model, and when there exists the instruction as to an image formation looking from a viewpoint of a body-shaped model, the image looking from the viewpoint of a body-shaped model, together with the image looking from a viewpoint other than the viewpoint of a body-shaped model, is displayed on the exclusive display window.

Figure 17:
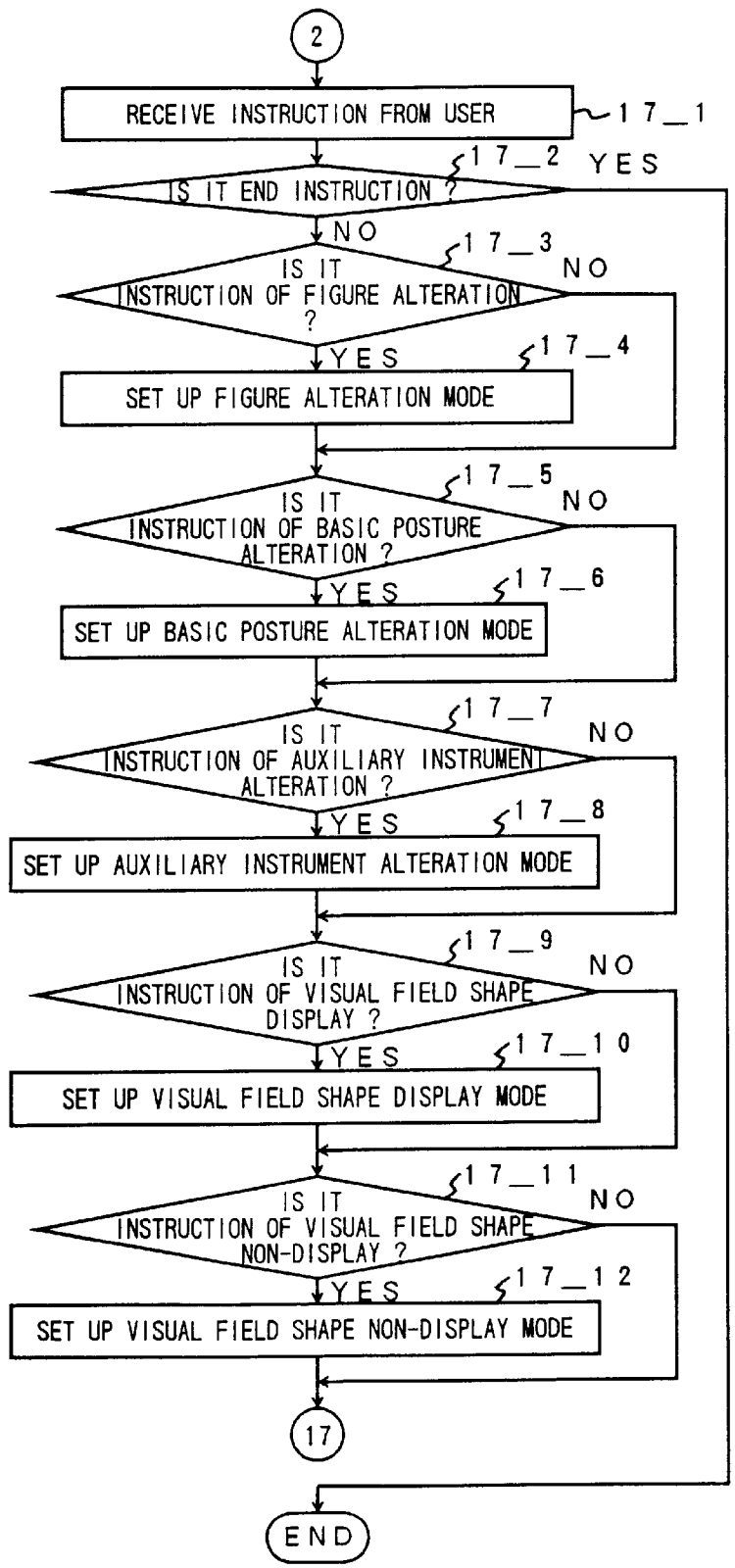

Next, the process goes to step 17_1 shown in FIG. 17 in which there is provided a state of waiting for an instruction from a user (an operator) of the apparatus for supporting an evaluation of equipment operability. When any one of the various types of instructions, which will be described hereinafter, is instructed by the operator, the process goes to step 17_2.

Hereinafter, there will be described a mode setting in the event that the various types of instructions are input. The contents of the various types of instructions will be described later.

In step 17_2, it is determined whether the instruction now input is a termination instruction, and if it is the termination instruction, the routine is terminated.

In step 17_3, it is determined whether the instruction input is an instruction of a body form alteration, and if it is, the process goes to step 17_4 in which the mode is set up as a body form alteration mode. More in detail, a flag for the body form alteration mode is established. This is the similar to that of other modes, and thus the explanation of the flag operation will be omitted.

In step 17_5, it is determined whether the instruction input is an instruction of a basic posture alteration, and if it is, the process goes to step 17_6 in which the mode is set up as a basic posture alteration mode.

In step 17_7, it is determined whether the instruction input is an instruction of an auxiliary instrument alteration, and if it is, the process goes to step 17_8 in which the mode is set up as an auxiliary instrument alteration mode.

In step 17_9, it is determined whether the instruction now input is an instruction of a visual field shape display, and if it is, the process goes to step 17_10 in which the mode is set up as a visual field shape display mode.

In step 17_11, it is determined whether the instruction input is an instruction of a visual field shape non-display, and if it is, the process goes to step 17_12 in which the mode is set up as a visual field shape non-display mode.

Figure 18:
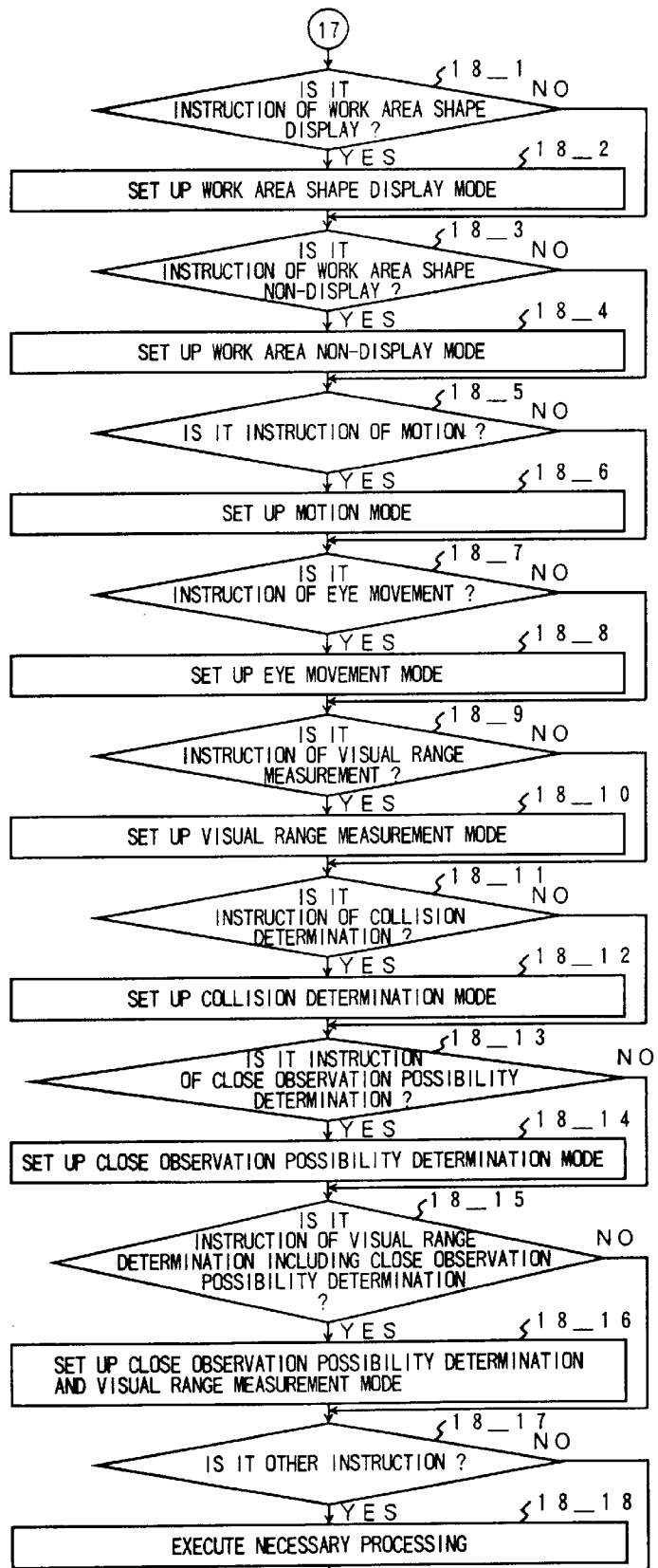

Further, the program proceeds to the flow shown in FIG. 18. In step 18_1, it is determined whether the instruction input is an instruction of a work area shape display, and if it is, the process goes to step 18_2 in which the mode is set up as a work area shape display mode.

In step 18_3, it is determined whether the instruction input is an instruction of a work area shape non-display, and if it is, the process goes to step 18_4 in which the mode is set up as a work area shape non-display mode.

In step 18_5, it is determined whether the instruction input is an instruction of an operation, and if it is, the process goes to step 18 6 in which the mode is set up as an operation mode.

In step 18_7, it is determined whether the instruction input is an instruction as an eye movement, and if it is, the process goes to step 18_8 in which the mode is set up as an eye movement mode.

In step 18_9, it is determined whether the instruction input is an instruction as to a visual range measurement, and if it is, the process goes to step 18_10 in which the mode is set up as a visual range measurement mode.

In step 18_11, it is determined whether the instruction input is an instruction of a collision determination, and if it is, the process goes to step 18_12 in which the mode is set up as a collision determination mode.

In step 18_13, it is determined whether the instruction input is an instruction of a close observation possibility determination, and if it is, the process goes to step 18_14 in which the mode is set up as a close observation possibility determination mode.

In step 18_15, it is determined whether the instruction input is an instruction of a visual range measurement including a close observation possibility determination, and if it is, the process goes to step 18_16 in which the mode is set up as a close observation possibility determination and visual range measurement mode.

With respect to steps 18_17 and 18_18, in a similar fashion to that of the above, when an instruction of other than that of the above-mentioned various types of instructions is input, the mode is set up as a mode associated with the input instruction. Here, the explanation of this case will be omitted.

In this manner, when the mode setting is performed, the process returns to step 15_6 of the flow shown in FIG. 15 in which the routine (FIGS. 19–31) associated with the set up a mode is executed. Hereinafter, there will be described the routines each corresponding to the associated one of the respective modes.

Figure 19:
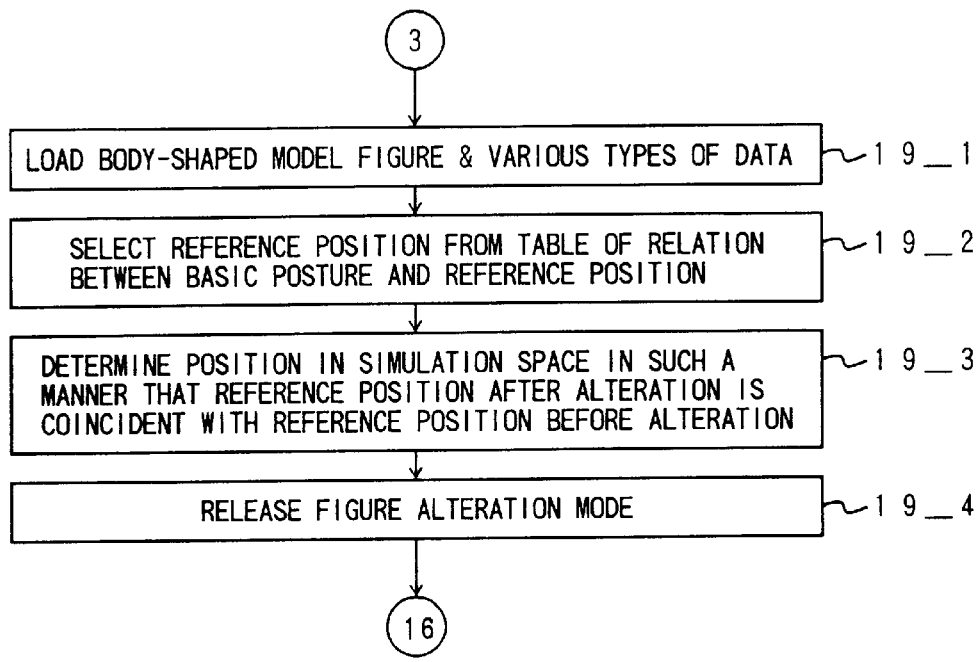
FIG. 19 is a flowchart useful for understanding a routine to be executed in a figure alteration mode.

FIG. 19 is a flowchart useful for understanding a routine to be executed in a figure alteration mode. The routine shown in FIG. 19 is executed when it is determined in step 15_6 shown in FIG. 15 that the mode is the body form (figure) alteration mode.

The figure alteration mode is a mode in which a body-shaped model arranged in a simulation space is altered to a body-shaped model having a different body form. In step 19_1, the body-shaped model shape concerned with the body form after alteration and various types of data, related to the body-shaped model, are loaded into the memory of the operation unit 200 (FIG. 14). In step 19_2, the reference position is selected on the basis of data defining a relation between the basic posture and the reference position, which data are stored in the file 210. In step 19_3, a position of the body-shaped model on the simulation space is determined in such a manner that the reference position after alteration in posture coincides with the reference position before alteration in posture.

In step 19_4, the figure alteration mode is released, and the program returns to step 16_7 of the flow shown in FIG. 16. In step 16_9, the body-shaped model after alteration in posture is displayed on the image screen. Incidentally, the release of the figure alteration mode in step 19_4 simply implies the release of the flag indicative of the figure alteration mode. This is similar as to the matter of the "release" of other modes.

Figure 20:
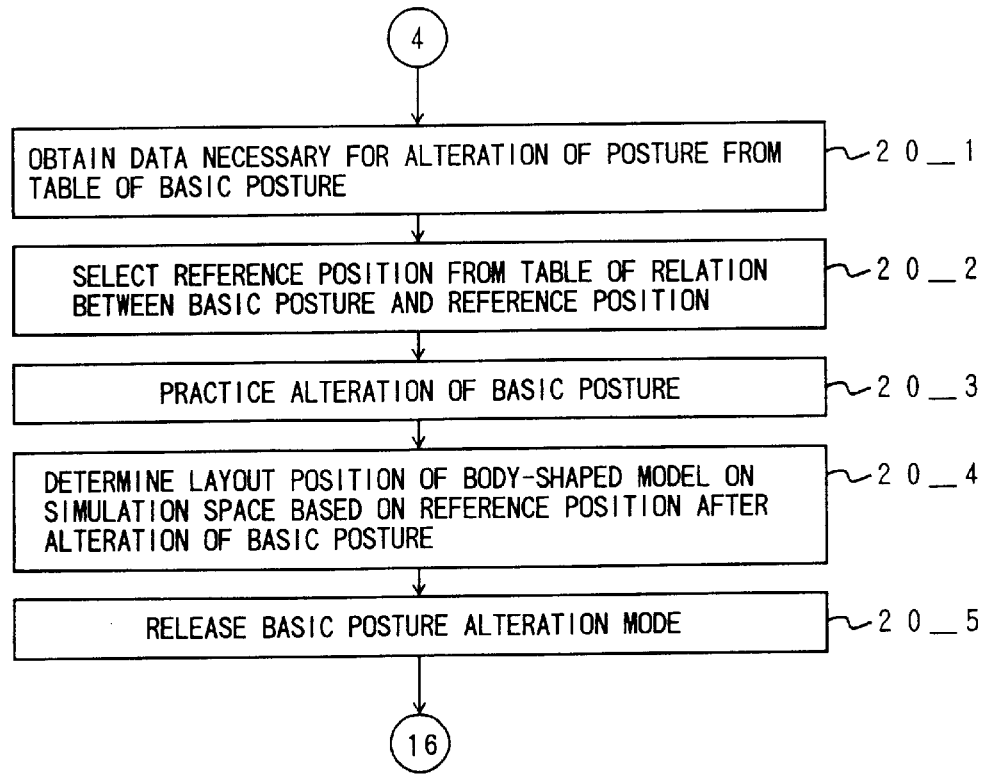
FIG. 20 is a flowchart useful for understanding a routine to be executed in a basic posture alteration mode.

FIG. 20 is a flowchart useful for understanding a routine to be executed in a basic posture alteration mode. The routine shown in FIG. 20 is executed when it is determined in step 15_7 in the flow shown in FIG. 15 that the mode is the posture alteration mode.

The basic posture alteration mode is a mode in which the basic posture of a body-shaped model is altered, for example, from a standing posture to a posture sitting on a chair.

In step 20_1, data necessary for the posture alteration is read from the basic posture table stored in file 208 shown in FIG. 14. In step 20_2, a reference position corresponding to the basic posture after the alteration is selected in accordance with a table indicative of a relation between the reference posture and the reference position, which table is stored in the file 210. In step 20_3, an alteration of the basic posture of the body-shaped model is implemented on an arithmetic operation. In step 20_4, an arrangement position of the body-shaped model on a simulation space is determined on the basis of the reference position after the alteration of the basic posture. In step 20_5, the basic posture alteration mode is released, and the process returns to step 16_7 of the flow shown in FIG. 16. In step 16_9, the body-shaped model after the alteration of the posture is displayed on the image screen.

Figure 21:
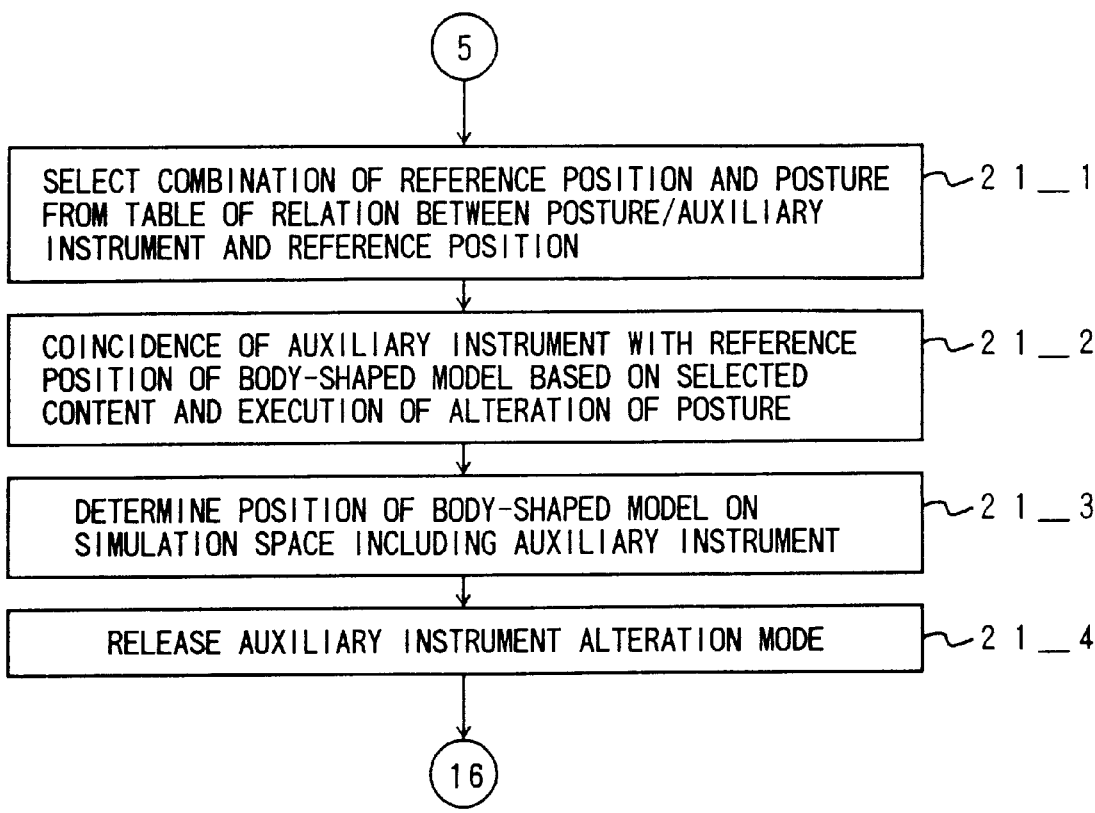
FIG. 21 is a flowchart useful for understanding a routine to be executed in an auxiliary instrument alteration mode.

FIG. 21 is a flowchart useful for understanding a routine to be executed in an auxiliary instrument alteration mode. The routine shown in FIG. 21 is executed when it is determined in step 15_8 in the flow shown in FIG. 15 that the mode is the auxiliary instrument alteration mode. The auxiliary instrument alteration mode is a mode in which the auxiliary instrument arranged in the simulation space is altered.

In step 21_1, a combination of the reference position and the posture concerned with the use of the auxiliary instrument after the alteration is selected in accordance with the table indicative of a relation between the posture/auxiliary instrument and the reference position, which table is stored in the file 210. In step 21_2, an auxiliary instrument and the reference position of the body-shaped model are coincident with each other on the basis of the selected content, and an arithmetic operation for altering the body-shaped model in its posture to a posture involved in the use of the auxiliary instrument is executed. In step 21_3, a position of the body-shaped model including the auxiliary instrument on the simulation space is determined. In step 21_4, the auxiliary instrument alteration mode is released, and the process returns to step 16_7 of the flow shown in FIG. 16. In step 16_9, the body-shaped model including the auxiliary instrument after the alteration is displayed on the image screen.

Figure 22:
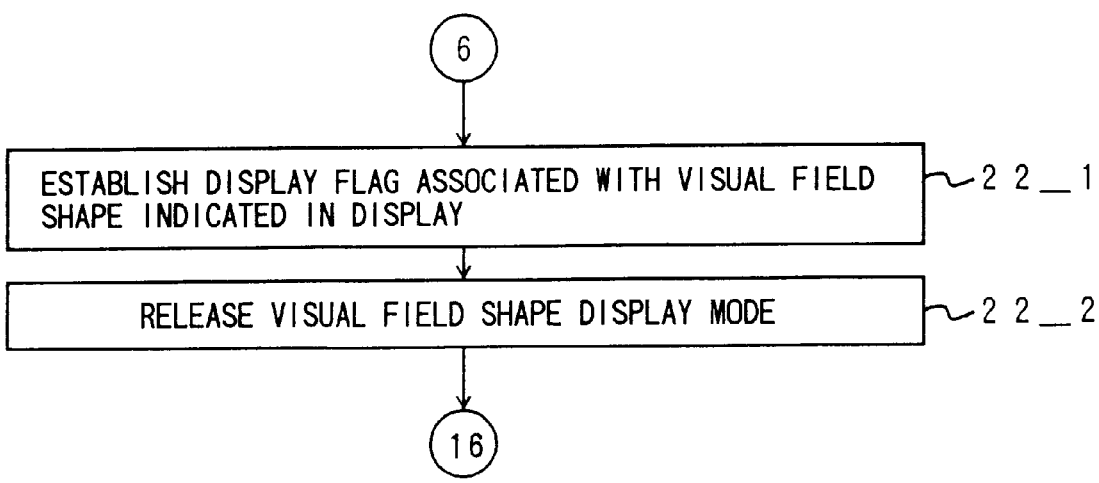
FIG. 22 is a flowchart useful for understanding a routine to be executed in a visual field figure display mode.

FIG. 22 is a flowchart useful for understanding a routine to be executed in a visual field figure display mode. The routine shown in FIG. 22 is executed when it is determined in step 15_9 in the flow shown in FIG. 15 that the mode is the visual field figure display mode. The visual field figure display mode is a mode in which a figure representative of the visual field shape of the body-shaped model arranged in the simulation space is displayed.

Figure 2:
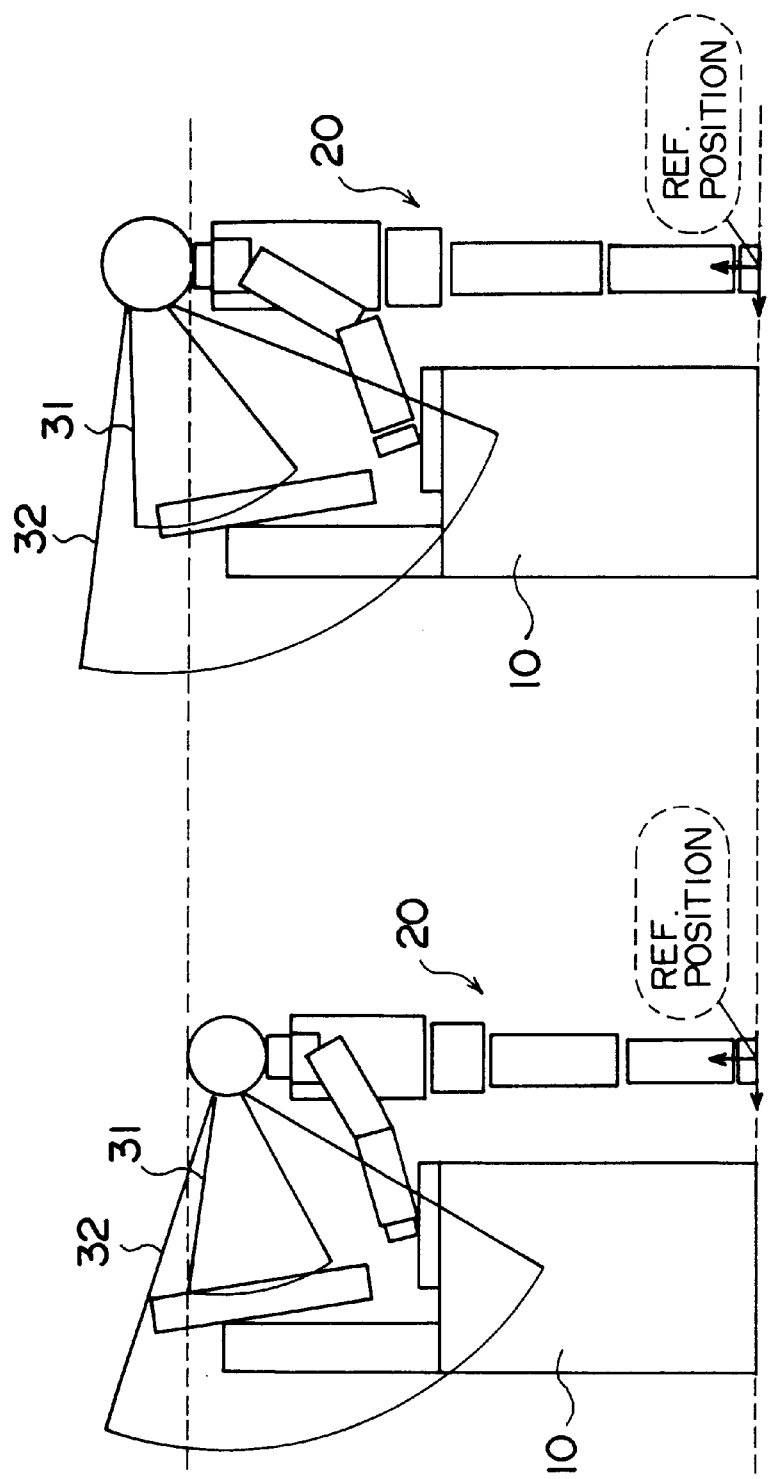
FIGS. 2(A) and 2(B) are illustrations showing a first example of images before and after an alteration of a body-shaped model.

In step 22_1, a display flag associated with the visual field figure indicated for a display is established. For example, FIG. 2 shows two types of visual field FIGS. 31 and 32. According to the present embodiment of the invention, it is possible to display a plurality of figures mutually different in degree of the visibility. Each of the figures is associated with a display flag, and when a certain display flag is set up, a visual field figure associated with the display flag set up is displayed.

In step 22_2, the visual field figure display mode is released, and the process returns to step 16_7 of the flow shown in FIG. 16. In steps 16_8 and 16_9, the visual field figure of the indicated visibility is displayed on the basis of the display flag.

Figure 23:
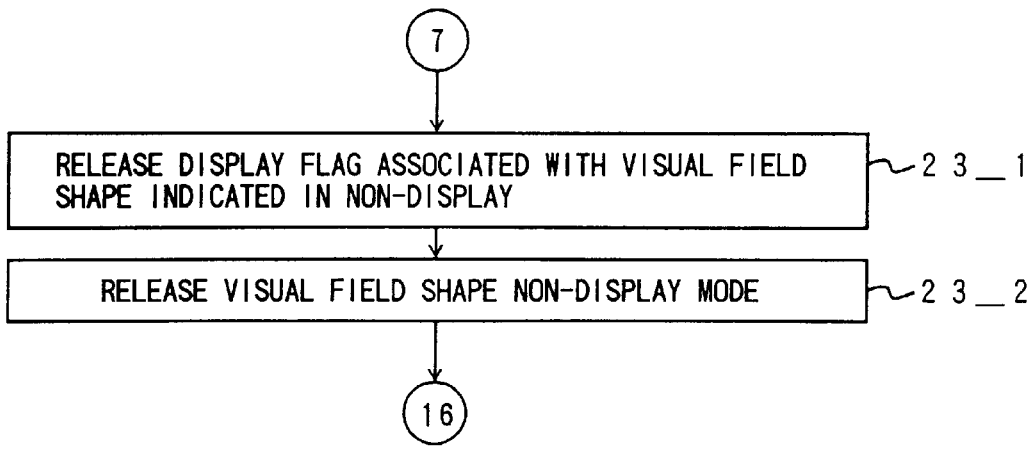
FIG. 23 is a flowchart useful for understanding a routine to be executed in a visual field figure non-display mode.

FIG. 23 is a flowchart useful for understanding a routine to be executed in a visual field figure non-display mode. The routine shown in FIG. 23 is executed when it is determined in step 15_10 in the flow shown in FIG. 15 that the mode is the visual field figure non-display mode. The visual field figure non-display mode is a mode in which a figure representative of the visual field shape of the body-shaped model arranged in the simulation space, which is now displayed, is altered to be a non-display state.

In step 23_1, a display flag associated with the visual field figure indicated with a non-display is released. In step 23_2, the visual field figure non-display mode is released, and the process returns to step 16_7 of the flow shown in FIG. 16. In steps 16_8 and 16_9, the visual field figure indicated with a non-display, of the figure representative of the visual field shape of the body-shaped model arranged in the simulation space, which is now displayed, is altered to be a non-display state on the basis of the display flag.

Figure 24:
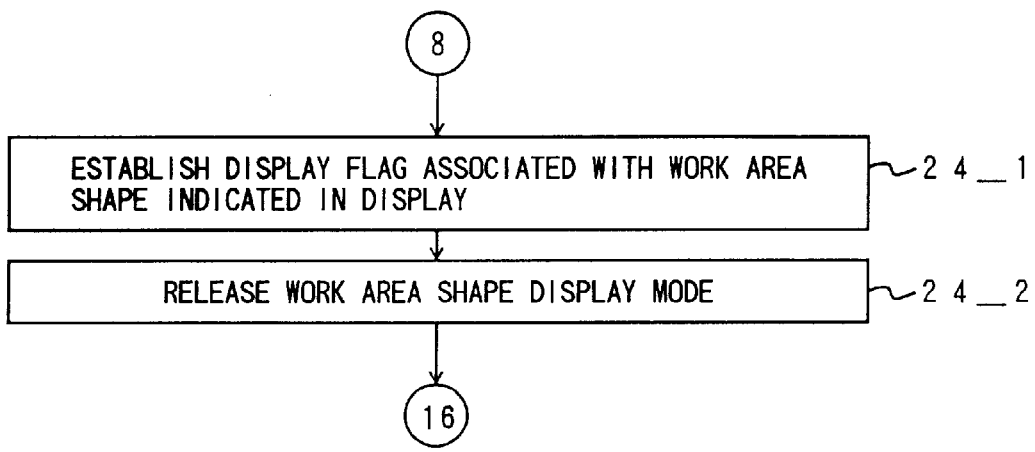
FIG. 24 is a flowchart useful for understanding a routine to be executed in a work area shape display mode.

FIG. 24 is a flowchart useful for understanding a routine to be executed in a work area shape display mode. The routine shown in FIG. 24 is executed when it is determined in step 15_11 in the flow shown in FIG. 15 that the mode is the work area shape display mode. The work area shape display mode is a mode in which a a figure representative of the work area shape of the body-shaped model arranged in the simulation space is displayed. With respect to the work area shape also, similar to the above-mentioned visual field shape, there exist work area shapes representative of a plurality of stages of work areas mutually different in working property, and also a work area shape on each of a plurality of segments or parts constituting a body-shaped model. The respective work area shapes are associated with each display flag.

In step 24_1, a display flag associated with the work area shape indicated for a display is established. In step 24_2, the work area shape display mode is released, and the process returns to step 16_7 of the flow shown in FIG. 16. In steps 16_8 and 16_9, the figure representative of the work area shape of the indicated work property is displayed on the basis of the display flag.

Figure 25:
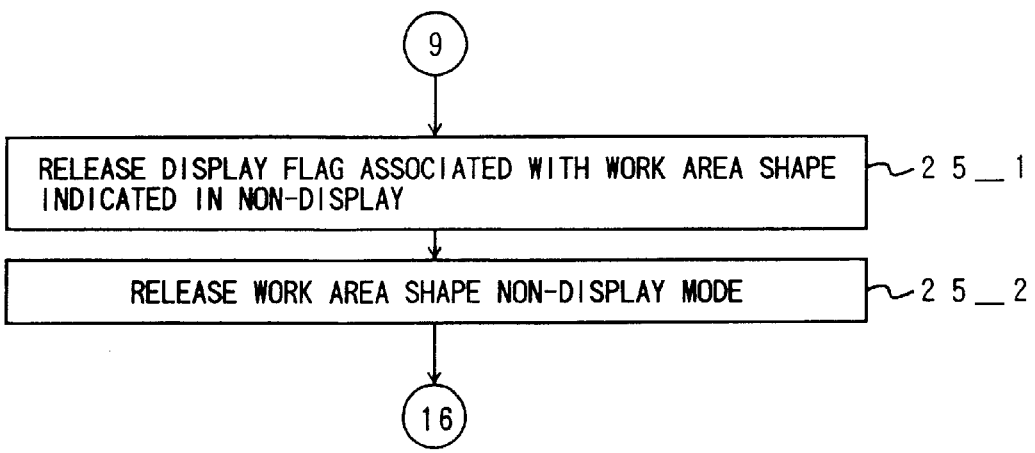
FIG. 25 is a flowchart useful for understanding a routine to be executed in a work area shape non-display mode.

FIG. 25 is a flowchart useful for understanding a routine to be executed in a work area shape non-display mode. The routine shown in FIG. 25 is executed when it is determined in step 15_12 in the flow shown in FIG. 15 that the mode is the work area shape non-display mode. The work area shape non-display mode is a mode in which a figure representative of the work area shape of the body-shaped model arranged in the simulation space, which is now displayed, is altered to be a non-display state.

In step 25_1, a display flag associated with the work area shape indicated with a non-display is released. In step 25_2, the work area shape non-display mode is released, and the process returns to step 16_7 of the flow shown in FIG. 16. In steps 16_8 and 16_9, the work area shape indicated with a non-display, of the figure representative of the work area shape, which is now displayed, is altered to be a non-display state on the basis of the display flag.

Figure 26:
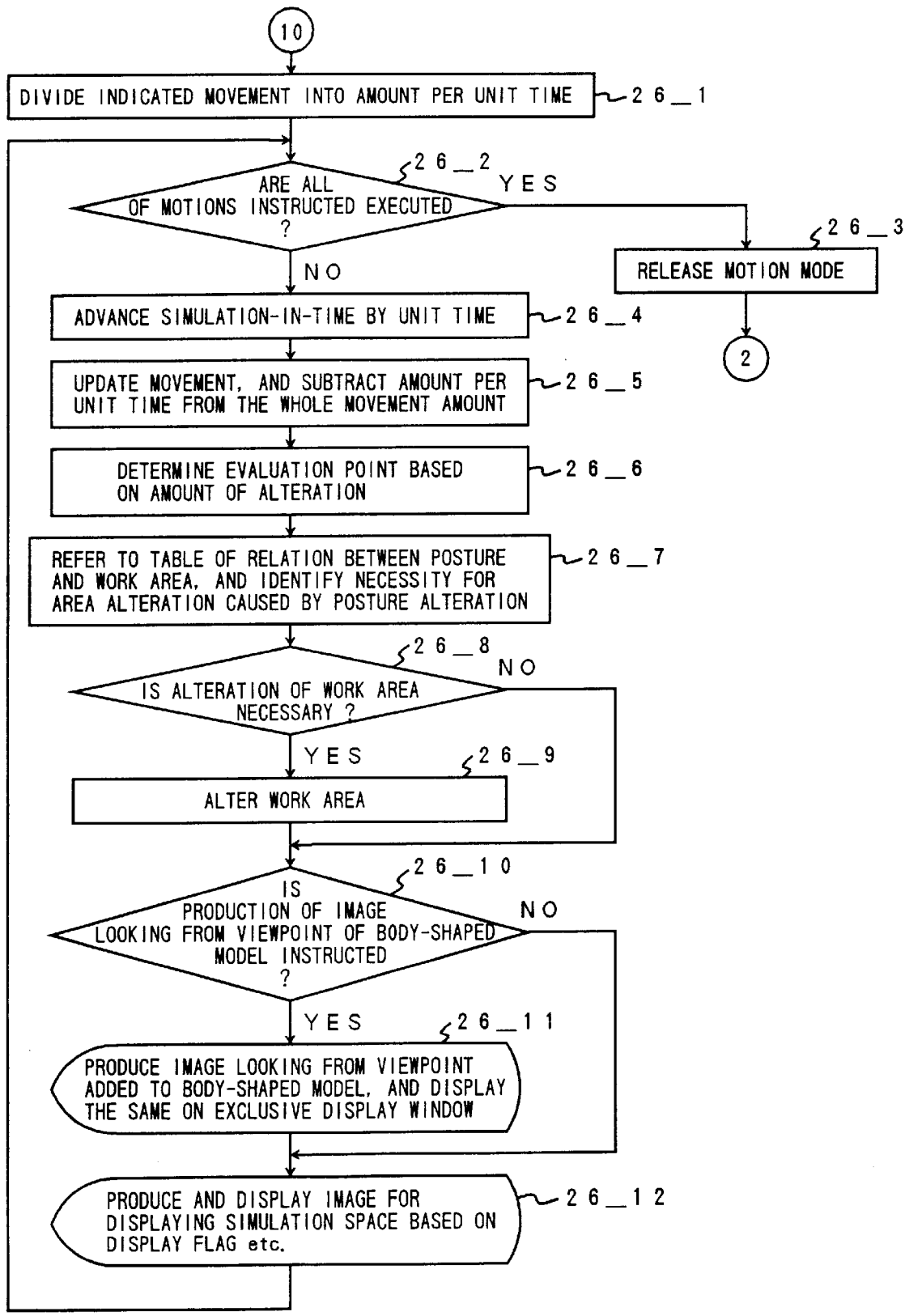
FIG. 26 is a flowchart useful for understanding a routine to be executed in a motion mode.

FIG. 26 is a flowchart useful for understanding a routine to be executed in a motion mode. The routine shown in FIG. 26 is executed when it is determined in step 16_1 in the flow shown in FIG. 16 that the mode is the operating mode. The operating mode is a mode in which when an action of a body-shaped model arranged in a simulation space is instructed, the action is performed.

In step 26_1, an arithmetic operation for dividing the instructed action into a minute amount of movement per unit time is effected.

In step 26_2, it is determined whether the instructed action is completely executed. When the instructed action is completely executed, the process goes to step 26_3 in which the operating mode is released and returns to step 17_1 of the flow shown in FIG. 1 wherein there is provided a state of waiting for an instruction from a user (an operator).

When the instructed action remains in its execution, the process goes to step 26_4 in which time in the simulation is advanced by the unit time. In step 26_5, the action of a body-shaped model is renewed by a step of minute amount of movement divided in step 26_1 and the minute amount of movement per unit time, which corresponds to the renewed minor movement, is subtracted from the whole movement amount to evaluate the remaining movement amount. In step 26_6, the file 211 is referred to determine an evaluation point based on amounts of alteration of position, velocity, acceleration and the like due to the renewed minor movement, and the evaluation point thus determined is recorded.

In step 26_7, the table stored in the file 209, in which a relation between the posture and the work area is recorded, is referred to when determining whether there is a need to alter the work area according to the posture alteration caused by the renewed minor movement. If it is determined that there is a need to alter the work area (step 26_8), the work area is altered (step 26_9).

In step 26_10, it is determined whether a generation of an image looking from a viewpoint of a body-shaped model is instructed. When it is determined that the generation of an image looking from a viewpoint of a body-shaped model is instructed, the process goes to step 26_11 in which the image looking from a viewpoint of a body-shaped model is generated and displayed on an exclusive window. In step 26_12, an image for displaying a simulation space looking from a viewpoint other than the viewpoint of a body-shaped model is produced and displayed, and the process returns to step 26_2.

In this manner, when the action of the body-shaped model is instructed, an amount of movement thus instructed is divided into a minute amount of movement per unit time, so that the body-shaped model moves a minute amount of movement. If necessary, the work area is altered, and the state of the action is displayed on an image screen and the action is evaluated.

Figure 27:
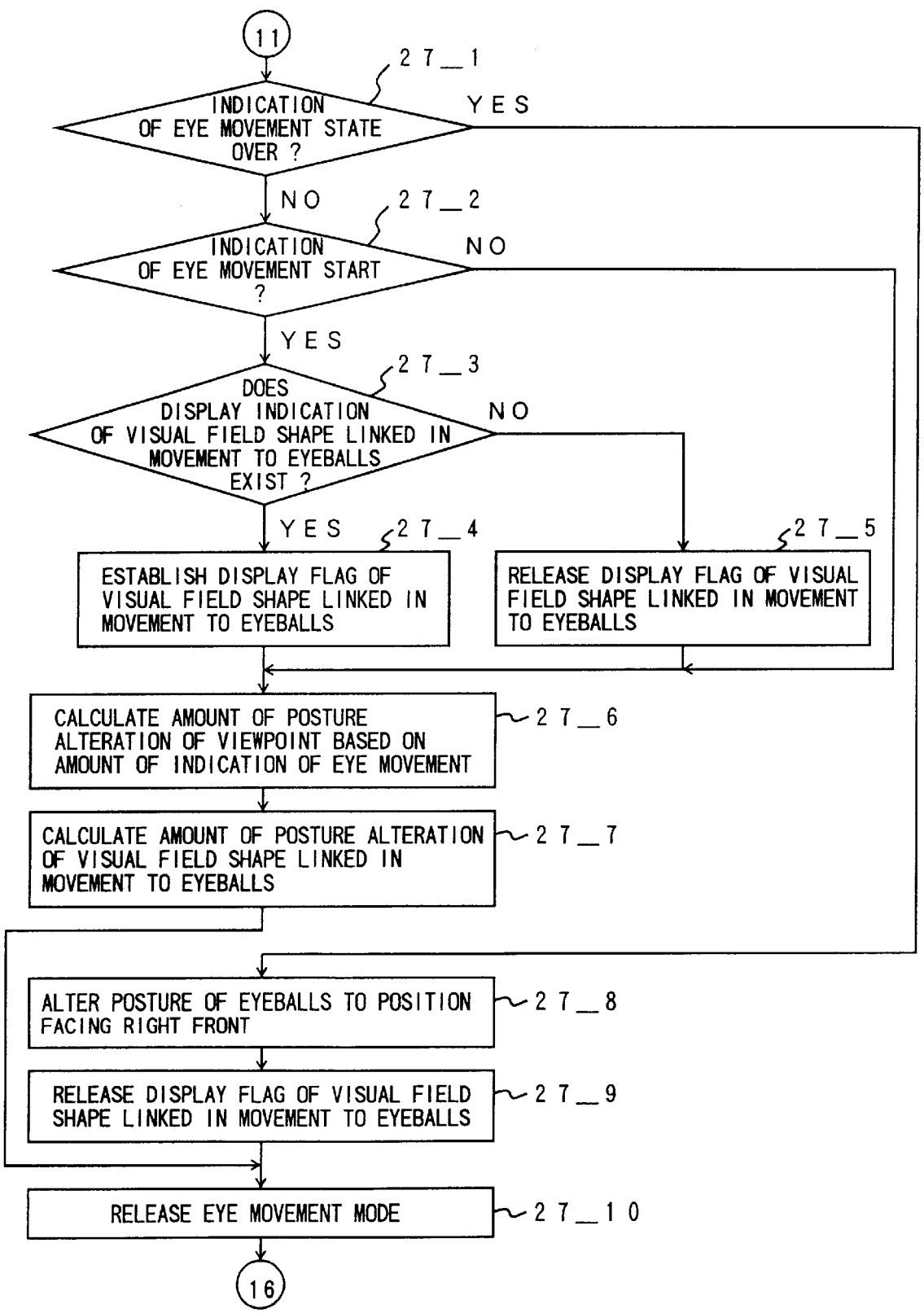
FIG. 27 is a flowchart useful for understanding a routine to be executed in an eye movement mode.

FIG. 27 is a flowchart useful for understanding a routine to be executed in an eye movement mode. The routine shown in FIG. 27 is executed when it is determined in step a 16_2 in the flow shown in FIG. 16 that the mode is the eye movement mode. The eye movement mode is a mode in which when an instruction as to an eye movement of a body-shaped model arranged in a simulation space is input, the eye movement based on the instruction is performed.

In step 27_1, it is determined whether the input instruction is concerned with an instruction for terminating the eye movement state. In step 27_2, it is determined whether the input instruction is concerned with an instruction for initiating the eye movement.

In step 27_2, when it is determined that the input instruction is concerned with an instruction for initiating the eye movement, the process goes to step-27_3 in which it is determined whether there is made such an instruction that a visual field shape linked in movement to a movement of eyeballs is to be displayed. The visual field shape linked in movement to a movement of eyeballs is, for example, the visual field patterns as shown in FIGS. 10(A) and 10(B), which vary in their position in accordance with a movement of eyeballs.

In accordance with a determination result as to whether there is made such an instruction that a visual field shape linked in movement to a movement of eyeballs is to be displayed in step 27_3, the process goes to step 27_4 or step 27_5. In step 27_4, a display flag of the visual field shape linked in movement to a movement of eyeballs is established. In step 27_5, the display flag of the visual field shape linked in movement to a movement of eyeballs is released.

In step 27_6, a posture alteration amount of a viewpoint, or an amount of alteration in looking direction is calculated on the basis of an indication quantity of an eye movement.

In step 27_7, a posture alteration amount of a visual field shape linked in movement to a movement of eyeballs, or a movement amount on an image screen is calculated, and the process goes to step 27_10 in which the eye movement mode is released and the process returns to step 16_7 of the flow shown in FIG. 16. In the event that the display flag of the visual field shape linked in movement to a movement of eyeballs is established, a figure representative of a visual field shape concerned with a close observation of a body-shaped model arranged in a simulation space moves in cooperation with the eye movement (step 16_8).

In step 27_2 of the routine shown in FIG. 27, when it is determined that the input instruction as to the eye movement is not concerned with an instruction for initiating the eye movement, in other words, when the eye movement is already initiated and thus an amount of movement of eyes is input, the process goes to step 27_6.

In step 27_1 of the routine shown in FIG. 27, when it is determined that the input instruction as to the eye movement is concerned with an instruction for terminating the eye movement state, the process goes to step 27_8 in which the posture of eyeballs is altered in position to face right in front for a case where the eye movement is resumed. In step 27_9, the display flag of the visual field shape linked in movement to a movement of eyeballs is released, and the process goes to step 27_10 in which the eye movement mode is released.

Figure 28:
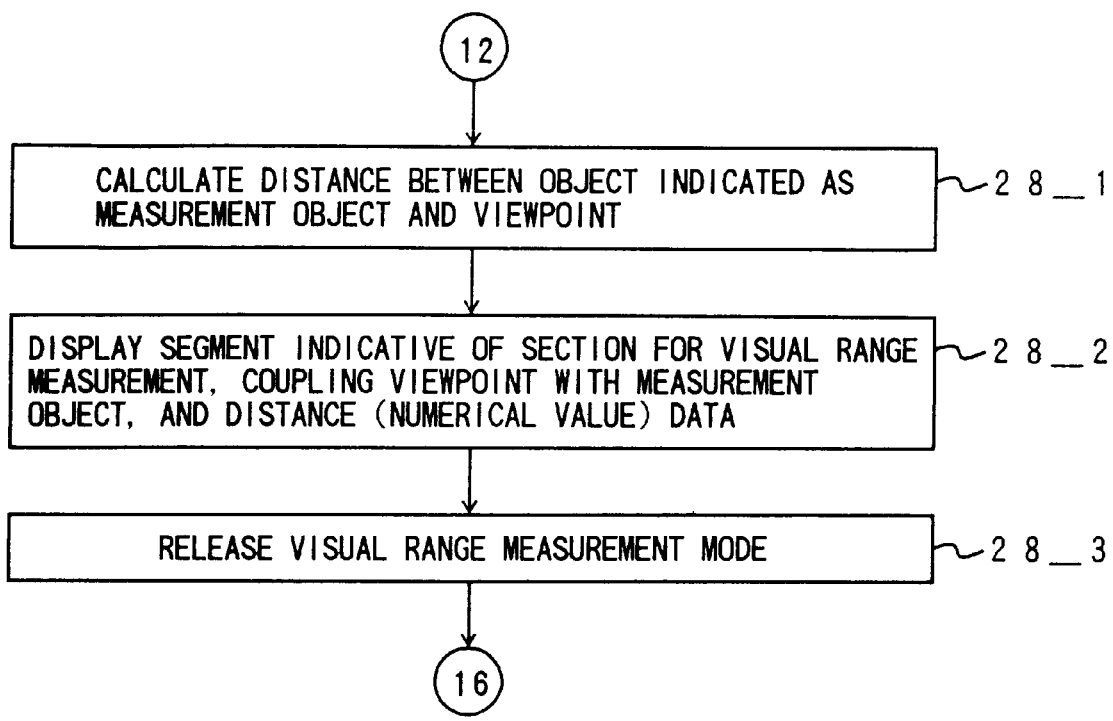
FIG. 28 is a flowchart useful for understanding a routine to be executed in a visual range measurement mode.

FIG. 28 is a flowchart useful for understanding a routine to be executed in a visual range measurement mode. The routine shown in FIG. 28 is executed when it is determined in step 16_3 in the flow shown in FIG. 16 that the mode is the visual range measurement mode. The visual range measurement mode is a mode in which a distance between a viewpoint of a body-shaped model arranged in a simulation space and an object observed by the body-shaped model is measured.

In step 28_1, a distance between a measurement object indicated by an operation of the input device 201 and the viewpoint is calculated. In step 28_2, line and distance (numerical values) data representative of a visual range are displayed on the image screen of the output device 202. In step 28_3, the visual range measurement mode is released, and the process returns to step 16_7 of the flow shown in FIG. 16.

Figure 29:
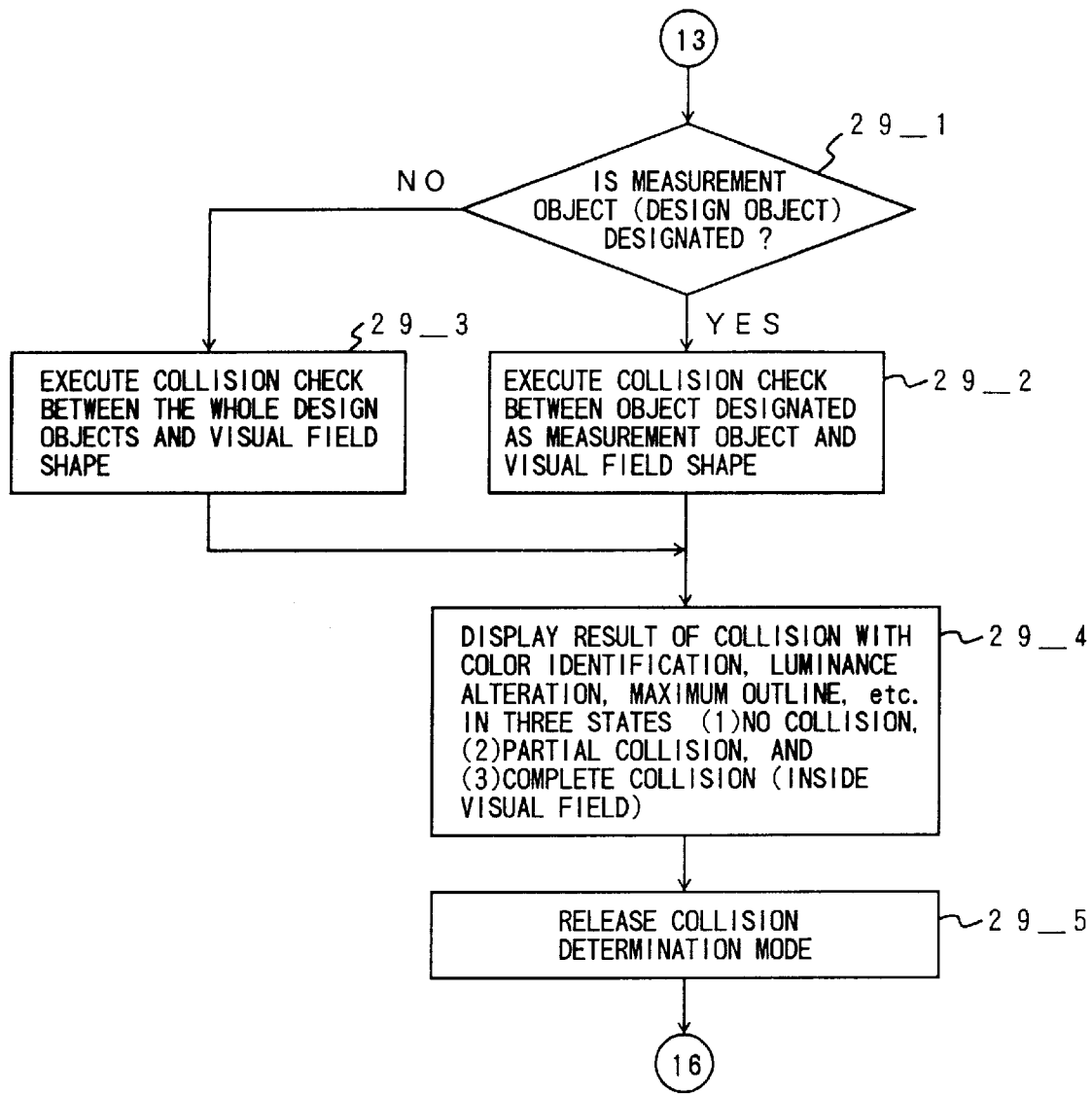
FIG. 29 is a flowchart useful for understanding a routine to be executed in a collision determination mode.

FIG. 29 is a flowchart useful for understanding a routine to be executed in a collision determination mode. The routine shown in FIG. 29 is executed when it is determined in step 16_4 in the flow shown in FIG. 16 that the mode is the collision determination mode. The collision determination mode is a routine for identifying whether an object comes in sight of a body-shaped model arranged in a simulation space by means of a collision determination of a three-dimensional configuration representative of a visual field of the body-shaped model with the object.

In step 29_1, it is determined whether the measurement object (design object) to be subjected to the collision determination is designated, and if it is designated, then the process goes to step 29_2 in which the collision check of the designated measurement object with the three-dimensional visual field configuration is carried out. When the measurement object (design object) is not in designated, the process goes to step 29_3 in which the collision check of all of the design objects arranged in the simulation space with the visual field configuration is carried out.

In step 29_4, a result of the collision determination in step 29_2 to step 29_3 is classified to three states such as (1) no collision (the object is out of the visual field configuration in its entirety), (2) a partial collision (a part of the object is in the state of collision), and (3) a complete collision (the object is inside the visual field configuration in its entirety), and is displayed in such a manner that these three states (1) to (3) are identified by a color identification, a luminance alteration, a line sort of the maximum outline encircling the object, etc.

In step 29_5, the collision determination mode is released, and the process returns to step 16_7 of the flow shown in FIG. 16.

Figure 30:
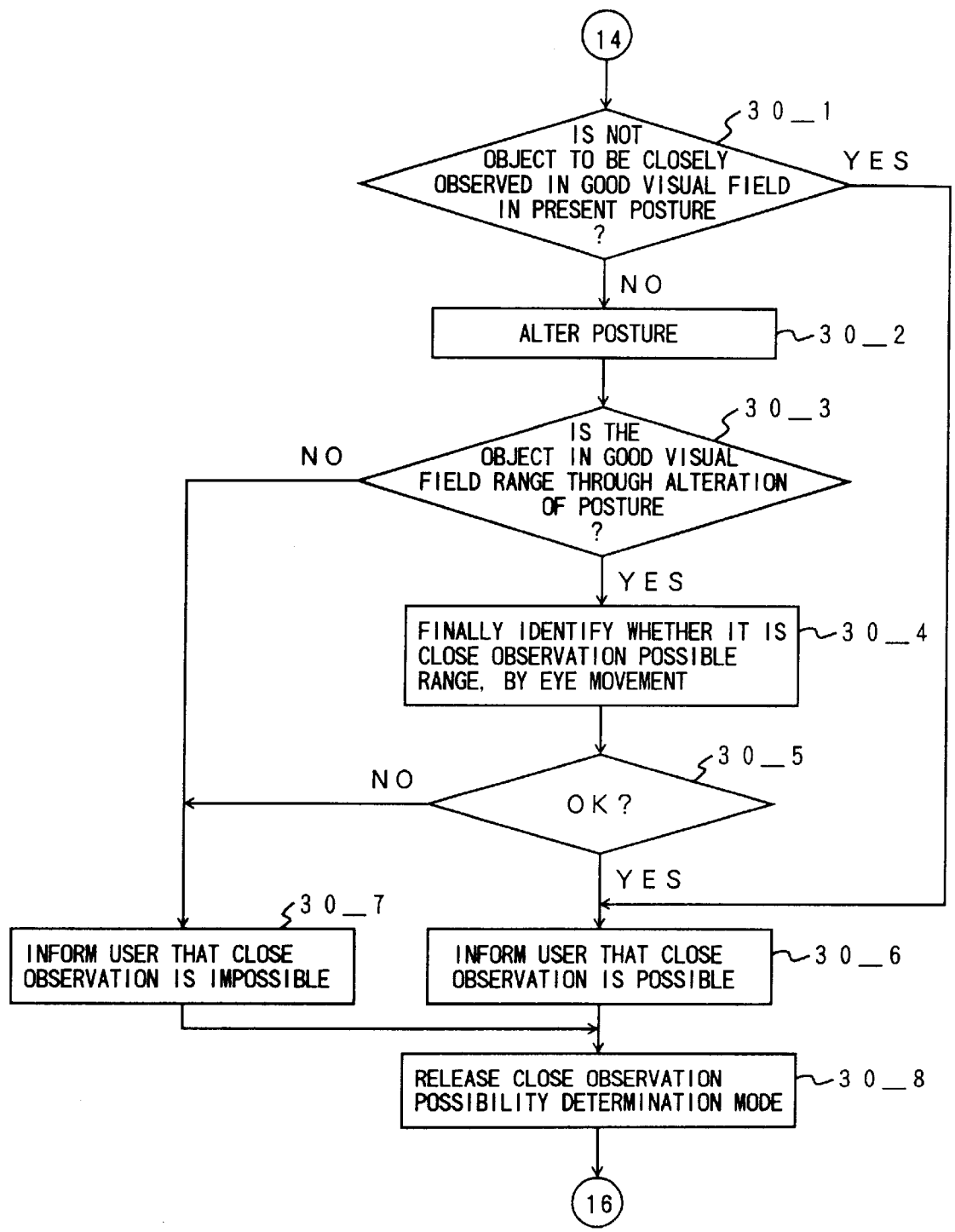
FIG. 30 is a flowchart useful for understanding a routine to be executed in a careful watch possibility determination mode.

FIG. 30 is a flowchart useful for understanding a routine to be executed in a careful watch or close observation possibility determination mode. The routine shown in FIG. 30 is executed when it is determined in step 16_5 in the flow shown in FIG. 16 that the mode is the close observation possibility determination mode. In the close observation possibility determination mode, it is determined whether a body-shaped model arranged in a simulation space can closely observe the designated object to be closely observed by means of moving the body within a range maintaining the basic posture (for example, the posture sitting on a chair). Here, the state after the body is moved within a range maintaining the basic posture is also referred to as the "posture".

In step 30_1, it is determined whether the object to be closely observed is in good sight of the body-shaped model in the present posture. When the object to be closely observed is in good sight of the body-shaped model already in the present posture, the process goes directly to step 30_6 in which it is displayed on the image screen that the object is closely observable, thereby informing the user (operator).

In step 30_1, when the object to be closely observed is not yet in good sight of the body-shaped model in the present posture, the process goes to step 30_2 in which the posture is altered in accordance with the operating method as described in connection with the embodiment shown in FIG. 1, that is, such an operating method that the movable segments or parts are sequentially moved one by one, for example, in such a manner that when the close observation was impossible through turning the head, then the upper part of the body is turned.

In step 30_3, it is determined whether the object to be closely observed is in good sight range of the body-shaped model by an alteration of the posture in step 30_2. When it is determined that the object is in good sight range, the process goes to step 30_4 in which it is finally identified whether the object to be closely observed is in the close observable range in its entirety by the eye movement, and if it is determined that the object is in the close observable range (step 30_5), the process goes to step 30_6 in which the user is informed that the object is in the close observable range.

On the other hand, in step 30_3, when it is determined that the object to be closely observed is not in good sight range of the body-shaped model even by an alteration of the posture, or when it is identified in the final determination in step 30_4 that the object is out of the close observable range, the process goes to step 30_7 in which the user is informed that the object is not in the close observable range.

In step 30_8, the close observation possibility determination mode is released, and the process returns to step 16_7 of the flow shown in FIG. 16.

Figure 31:
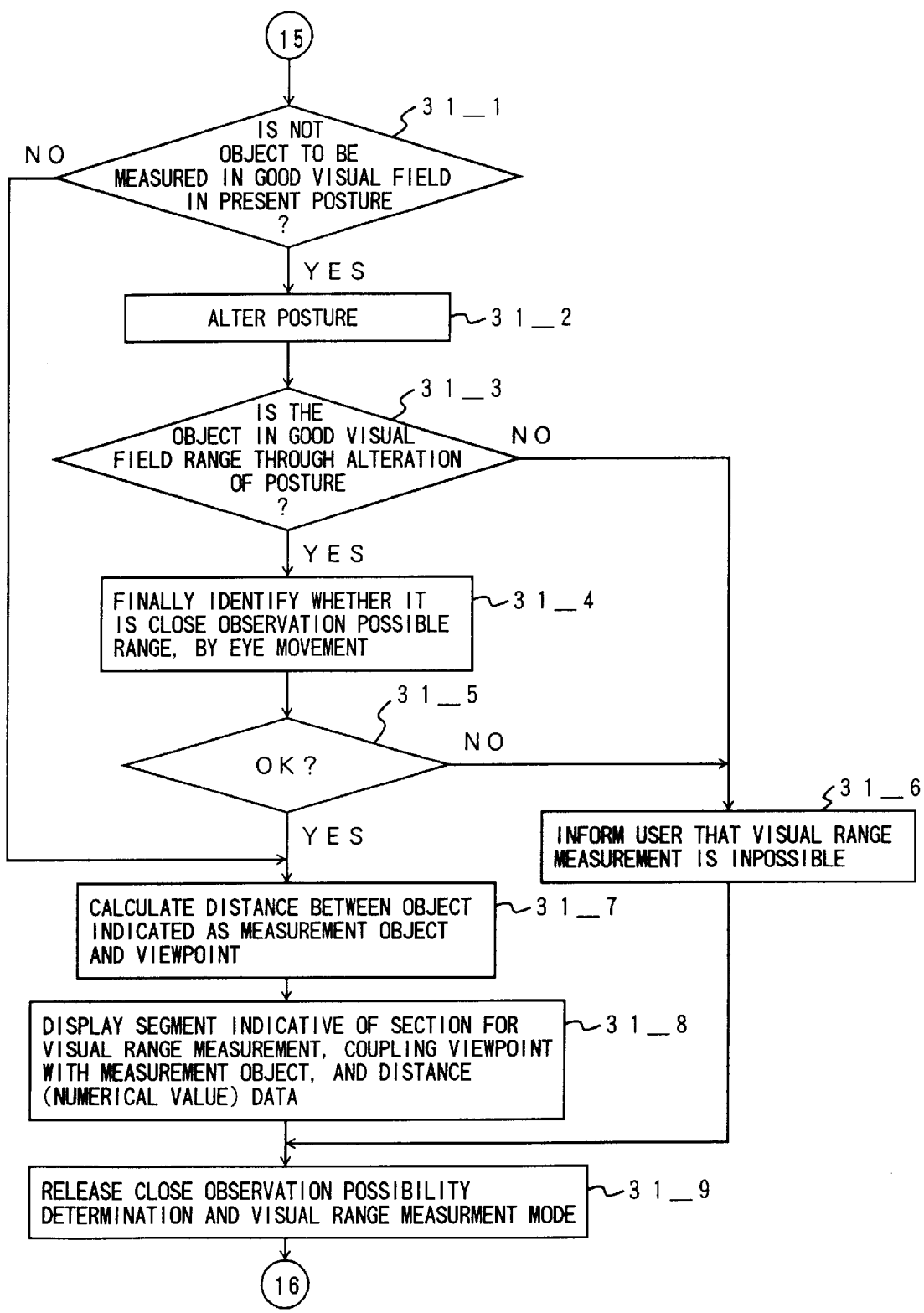
FIG. 31 is a flowchart useful for understanding a routine to be executed in a careful watch possibility determination and visual range measurement mode.

FIG. 31 is a flowchart useful for understanding a routine to be executed in a careful watch or close observation possibility determination and visual range measurement mode. The routine shown in FIG. 31 is executed when it is determined in step 16__6 in the flow shown in FIG. 16 that the mode is the close observation possibility determination and visual range measurement mode. In the close observation possibility determination and visual range measurement mode, it is determined as to whether the object can be closely observed by an alteration of the posture within a range that the basic posture is maintained, and if it is determined that the object can be closely observed, the visual range is calculated with respect to the posture concerned with the close observation. That is, the routine shown in FIG. 31 is a combination of the routine of close observation possibility determination shown in FIG. 30 and the routine of visual range measurement shown in FIG. 28.

Steps 31__1 to 31__5 and 31__6 are similar in operation to steps 30__1 to 30__5 and 30__7, respectively, of the routine executed in the close observation possibility determination mode shown in FIG. 30. Thus, redundant explanation will be omitted.

When it is determined that the object is closely observable, the process goes to step 31__7 in which in a similar fashion to that of step 28__1 of the routine shown in FIG. 28, a distance (visual range) between the measurement object and the viewpoint is calculated. In step 31__8, in a similar fashion to that of step 28__2 of the routine shown in FIG. 28, line and distance (numerical values) data representative of a visual range are displayed on the image screen of the output device 202.

In step 31__9, the close observation possibility determination and visual range measurement mode is released, and the process returns to step 16__7 of the flow shown in FIG. 16.

As explained above, according to the present invention, it is possible to readily and exactly verify operability of equipment through a simulation.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An apparatus for supporting an evaluation of equipment operability in which an equipment model simulating a shape of an evaluation object equipment is arranged together with a body-shaped model simulating a shape of a human body in a three-dimensional virtual space, and an evaluation of operability of the evaluation object equipment is supported by means of moving the body-shaped model in the three-dimensional virtual space, and apparatus comprising:

a body-shaped model storage unit for storing a plurality of body-shaped models each simulating a shape of a human body and given with a definition of a reference position, the reference position being set up in such a manner that when the plurality of body-shaped models are classified into one or more groups, the reference positions are located at mutually different positions on a body in associated groups, respectively, and the reference positions are located at a common position on a body in each group;

a body-shaped model selecting means for optionally selecting a body-shaped model arrangement in the three-dimensional virtual space from among the body-shaped models stored in said body-shaped model storage unit;

model arrangement means for providing such a model arrangement that the equipment model is arranged together with the body-shaped model selected by said body-shaped model selecting means in the three-dimensional virtual space, and when said body-shaped model selecting means selects, as a body-shaped model to be arranged in the three arranged in the three-dimensional virtual space, the body-shaped model after an alteration in the three-dimensional virtual space in such a manner that the reference position of the body-shaped model before an alteration coincides with the reference position of the body-shaped model after an alteration in the three-dimensional virtual space; and an image display unit for displaying the three-dimensional virtual space, in which the equipment model and the body shaped model are arranged by said model arrangement means, with an image looking from a viewpoint different from a viewpoint of the body-shaped model.

2. An apparatus for supporting an evaluation of equipment operability according to claim 1, wherein said body-shaped model storage unit comprises:

a body-shaped model segments storage unit for storing body-shaped model segments simulating shapes of respective parts of a body for constituting a plurality of body-shaped models simulating respective shapes of a plurality of human bodies mutually different in a body form;

a segment arrangement data storage unit for storing segment arrangement data to constitute a body-shaped model by arranging the body-shaped model segments stored in said body-shaped model segments storage unit, the segment arrangement data being stored in said segment arrangement data storage unit in association with each of a plurality of postures of the body-shaped model; and a reference position data storage unit for storing reference position data representative of a reference position on a body-shaped model of which a position in the three-dimensional virtual space is defined regardless of a body form of the body-shaped model when the body-shaped model is arranged in the three-dimensional virtual space, wherein said body-shaped model selecting means comprises:

figure selecting means for optionally selecting a figure of a body-shaped model to be arranged in the three-dimensional virtual space; and posture designating means for optionally designating a posture of a body-shaped model to be arranged in the three-dimensional virtual space, and wherein said model arrangement mean provides such a model arrangement that the equipment model is arranged in the three-dimensional virtual space, and in addition a body-shaped model having the figure selected by said figure selecting means is arranged in the posture designated by said posture designating means in the three-dimensional virtual space, and when the figure of the body-shaped model arranged in the three-dimensional virtual space is altered by said figure selecting means, the body-shaped model before an alteration is replaced by the body-shaped model after an alteration in the three-dimensional virtual space in such a manner that the posture of the body-shaped model after an alteration is identical to the posture of the body-shaped model before an alteration, and the reference position of the body-shaped model before an alteration coincides with the reference position of the body-shaped model after an alteration in the three-dimensional virtual space.

3. An apparatus for supporting an evaluation of equipment operability according to claim 2, wherein said segment arrangement data storage unit stores movable limit data representative of a movable limit of segments of a body-shaped model in association with each of a plurality of postures of the body-shaped model, said apparatus further comprises movement instruction means for instructing a movement of the body-shaped model arranged in the three-dimensional virtual space, and said model arrangement means moves the body-shaped model arranged in the three-dimensional virtual space within a movable limit according to the posture of the body-shaped model in response to a movement instruction for the body-shaped model by said movement instruction means.

4. An apparatus for supporting an evaluation of equipment operability according to claim 3, further comprising movement evaluation means for evaluating movement of the body-shaped model arranged in the three-dimensional virtual space.

5. An apparatus for supporting an evaluation of equipment operability in which an equipment model simulating a shape of an evaluation object equipment is arranged together with a body-shaped model simulating a shape of a human body in a three-dimensional virtual space, and an evaluation of operability of the evaluation object equipment is supported by means of moving the body-shaped model in the three-dimensional virtual space, and apparatus comprising:

a visual field pattern storage unit for storing a visual field pattern representative of a visual field of a body-shaped model; and an image display unit for displaying the three-dimensional virtual space, in which the equipment model and the body-shaped model are arranged, with an image looking for a viewpoint different from a viewpoint of the body-shaped model, and in addition displaying the visual field pattern representative of a visual field of a body-shaped model.

6. An apparatus for supporting an evaluation of equipment operability according to claim 5, wherein said visual field pattern storage unit stores a plurality of visual field patterns representative of a plurality of stages of visual fields mutually different in degree of visibility, said apparatus further comprises a visual field selecting means for selecting visual fields for a display from among the plurality of stages of visual fields, permitting a simultaneous selection of the plurality of stages of visual fields, and said image display unit displays the visual field patterns representative of one or more stages of visual fields selected by said visual field selecting means, of the body-shaped model appearing on the image of the display screen.

7. An apparatus for supporting an evaluation of equipment operability in which an equipment model simulating a shape of an evaluation object equipment is arranged together with a body-shaped model simulating a shape of a human body in the three-dimensional virtual space, and an evaluation of operability of the evaluation object equipment is supported by means of moving the body-shaped model in the three-dimensional virtual space, said apparatus comprising:

a visual field pattern storage unit for storing a plurality of visual field patterns indexing a plurality of stages of visual field limits mutually different in degree of visibility, on an image looking from a viewpoint of a body-shaped model arranged in the three-dimensional virtual space, a visual field selecting means for selecting visual field limits for a display from among the plurality of stages of visual field limits, permitting a simultaneous selection of the plurality of stages of visual field limits, and an image display unit for displaying the image looking from a viewpoint of the body-shaped model arranged in the three-dimensional virtual space, and also displaying the visual field patterns representative of one or more stages of visual field limits selected by said visual field selecting means.

8. An apparatus for supporting an evaluation of equipment operability according to claim 7, wherein said apparatus further comprises an eyeball movement instruction means for instructing a movement of eyeballs of the body-shaped model arranged in the three-dimensional virtual space, and said image display unit links in movement one of the visual field patterns displayed, looking from a viewpoint of the body-shaped model to the movement of eyeballs of the body-shaped model by said eyeball movement instruction means.

9. An apparatus for supporting an evaluation of equipment operability according to claim 1, wherein said apparatus further comprises:

object designating means for designating a desired object appearing on an image of a screen of said image display unit; and distance calculating means for calculating a distance between the object in the three-dimensional virtual space, designated by said object designating means, and a viewpoint of the body-shaped model arranged in the three-dimensional virtual space.

10. An apparatus for supporting an evaluation of equipment operability according to claim 1, wherein said apparatus further comprises visual field in and out determination means for determining whether the equipment model arranged in the three-dimensional virtual space is in the visual field of the body-shaped model arranged in the three-dimensional virtual space, and said image display unit displays on an image screen a determination result by said visual field in and out determination means.

11. An apparatus for supporting an evaluation of equipment operability according to claim 2, wherein said apparatus further comprises:

object designating means for designating a desired object appearing on an image of a screen of said image display unit; and visibility determination means for determining whether the object in the three-dimensional virtual space, designated by said object designating means, is visible for the body-shaped model arranged in the three-dimensional virtual space through a movement of the body-shaped model within a movable limit according to the posture thereof in the three-dimensional virtual space.

12. An apparatus for supporting an evaluation of equipment operability according to claim 11, wherein said apparatus further comprises distance calculating means for calculating a distance between the object and a viewpoint of the body-shaped model when it is determined by said visibility determination means that the object is visible.

13. An apparatus for supporting an evaluation of equipment operability in which an equipment model simulating a shape of an evaluation object equipment is arranged together with a body-shaped model simulating a shape of a human body in a three-dimensional virtual space, and an evaluation of operability of the evaluation object equipment is supported by means of moving the body-shaped model in the three-dimensional virtual space, said apparatus comprising:

an area index pattern storage unit for storing an area index pattern representative of a work possible area of the body-shaped model in the three-dimensional virtual space, in associating with a posture of the body-shaped model; and an image display unit for displaying the three-dimensional virtual space, in which the equipment model and the body-shaped model are arranged, with an image looking from a viewpoint different from a viewpoint of the body-shaped model, and in addition displaying on said image display unit the area index pattern representative of a work possibly area of a body-shaped model.

14. An apparatus for supporting an evaluation of equipment operability according to claim 13, wherein said area index pattern storage unit stores a plurality of work index patterns representative of a plurality of states of work possibly area mutually different in degree of working property, said apparatus further comprises work possible area selecting means for selecting work possible areas for a display from among the plurality of stages of work possible areas, permitting a simultaneous selection of the plurality of stages of work possible areas, and said image display unit displays the area index patterns representative of one or more states of work possible areas selected by said work possible area selecting means, of the body-shaped model appearing on said image display unit.

* * * * *